(12) United States Patent
Hemminger et al.

(10) Patent No.: US 6,504,357 B1
(45) Date of Patent: *Jan. 7, 2003

(54) APPARATUS FOR METERING ELECTRICAL POWER AND ELECTRONICALLY COMMUNICATING ELECTRICAL POWER INFORMATION

(75) Inventors: Rodney C. Hemminger; Mark L. Munday, both of Raleigh, NC (US)

(73) Assignee: ABB Automation Inc., Wickliffe, OH (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/048,800

(22) Filed: Mar. 26, 1998

Related U.S. Application Data

(63) Continuation of application No. 08/479,013, filed on Jun. 7, 1995, which is a continuation of application No. 07/839,634, filed on Feb. 21, 1992, now Pat. No. 5,537,029.

(51) Int. Cl.[7] .......................... G01R 21/06; G01R 35/04
(52) U.S. Cl. ........................ 324/142; 702/60; 702/64
(58) Field of Search ............................. 324/142, 141; 702/60, 61, 62, 64, 65

(56) References Cited

U.S. PATENT DOCUMENTS

| 2,724,821 A | 11/1955 | Schweitzer, Jr. ............ 324/127 |
| 3,794,917 A | 2/1974 | Martin et al. ................ 324/142 |
| 3,806,875 A | 4/1974 | Georget ................. 340/870.29 |
| 3,826,985 A | 7/1974 | Wiley ......................... 324/173 |

(List continued on next page.)

FOREIGN PATENT DOCUMENTS

| AU | 68113/87 | 8/1987 |
| EP | 0 092 303 B1 | 10/1986 |
| EP | 0 288 413 | 10/1990 |

(List continued on next page.)

OTHER PUBLICATIONS

Laumann, H, et al., "Class 0,5 Precision Meter with Solid–State Measuring Elements", *Landis & Gyr Review*, Sep. 1974.

(List continued on next page.)

*Primary Examiner*—Ernest Karlsen
(74) *Attorney, Agent, or Firm*—Woodcock Washburn LLP

(57) ABSTRACT

An apparatus for electronically communicating metered electrical power is disclosed. A first processor receives voltage and current signals and determines electrical power. The first processor generates an power signal representative of the electrical power determination. A second processor, connected to said first processor, receives the power signal and generates an output signal representative of electrical power information. A output device is connected to receive the output signal to output the electrical power information. The first processor determines units of electrical power from the voltage and current signals and to generates an power signal representative of the determination of such units and the rate at which the units are determined. The output devices may be one of a display, optical port and an option connector. When the output device is a display, the second processor may generate a disk signal representative of a rate of disk rotation in relation to the rate at which the units are determined, wherein the output signal to the display is representative of the units, the rate at which said units are determined, and the rate of disk rotation. The first processor, while concurrently determining units of electrical power, further may determine watt units, apparent reactive power units and the rate at which such units are determined, wherein the watt units, the apparent reactive power units and the rate at which such units are determined are displayed. The first processor may also meter multiple types of electrical power and generates power signals. The second processor, when connected to the optical port, generates an output signal in response to the power signals, wherein the generation of the output signal includes the multiplexing of the power signals into the output signal.

34 Claims, 14 Drawing Sheets

U.S. PATENT DOCUMENTS

| | | | |
|---|---|---|---|
| 3,976,941 A | 8/1976 | Milkovic | 324/142 |
| 4,007,061 A | 2/1977 | Le Couturier | |
| 4,034,292 A | 7/1977 | McCelland, III | 340/870.02 |
| 4,077,061 A | 2/1978 | Johnston et al. | 364/483 |
| 4,092,592 A | 5/1978 | Milkovic | 324/142 |
| 4,096,436 A | 6/1978 | Cook et al. | 324/142 |
| 4,119,948 A | 10/1978 | Ward et al. | 340/870.02 |
| 4,120,031 A | 10/1978 | Kincheloe et al. | 324/113 |
| 4,131,844 A | 12/1978 | Hucker et al. | 324/107 |
| 4,156,273 A | 5/1979 | Sato | 363/56 |
| 4,156,931 A | 5/1979 | Adelman et al. | |
| 4,156,932 A | 5/1979 | Adelman et al. | |
| 4,158,810 A | 6/1979 | Leskovar | 324/127 |
| 4,186,339 A | 1/1980 | Finger | 324/126 |
| 4,209,826 A | 6/1980 | Priegnitz | 363/21 |
| 4,213,119 A | 7/1980 | Ward | 340/151 |
| 4,283,772 A | 8/1981 | Johnston | 324/142 |
| 4,291,375 A | 9/1981 | Wolf | 364/483 |
| 4,298,839 A * | 11/1981 | Johnston | 324/157 |
| 4,301,508 A | 11/1981 | Anderson et al. | 364/483 |
| 4,315,248 A | 2/1982 | Ward | 340/825.72 |
| 4,335,445 A | 6/1982 | Nercessian | 364/483 |
| 4,355,361 A | 10/1982 | Riggs et al. | |
| 4,359,684 A | 11/1982 | Ley | 324/142 |
| 4,361,877 A | 11/1982 | Dyer et al. | 702/176 |
| 4,378,524 A | 3/1983 | Steinmüller | 324/107 |
| 4,389,702 A | 6/1983 | Clemente et al. | 363/21 |
| 4,399,510 A | 8/1983 | Hicks | 364/464 |
| 4,407,061 A | 10/1983 | Grodkiewiez et al. | 438/38 |
| 4,415,853 A | 11/1983 | Fisher | 340/870.02 |
| 4,420,721 A | 12/1983 | Dorey et al. | 324/110 |
| 4,422,039 A | 12/1983 | Davis | 324/127 |
| 4,437,059 A | 3/1984 | Hauptmann | 324/142 |
| 4,438,485 A | 3/1984 | Voigt | 363/21 |
| 4,439,764 A | 3/1984 | York et al. | 340/870.02 |
| 4,467,434 A | 8/1984 | Hurley et al. | 324/142 |
| 4,489,384 A | 12/1984 | Hurley et al. | 364/483 |
| 4,497,017 A | 1/1985 | Davis | 363/49 |
| 4,509,128 A | 4/1985 | Coppola et al. | 364/483 |
| 4,516,213 A | 5/1985 | Gidden | 364/483 |
| 4,542,469 A | 9/1985 | Brandyberry et al. | 364/483 |
| 4,566,060 A | 1/1986 | Hoeksma | 363/21 |
| 4,581,705 A | 4/1986 | Gilker et al. | 364/483 |
| 4,600,881 A | 7/1986 | LaRocca | 324/74 |
| 4,607,320 A | 8/1986 | Matui et al. | 363/21 |
| 4,621,330 A | 11/1986 | Weikel | 364/483 |
| 4,622,627 A | 11/1986 | Rodriguez et al. | 363/37 |
| 4,623,960 A | 11/1986 | Eng | 363/21 |
| 4,642,634 A | 2/1987 | Gerri et al. | 340/870.02 |
| 4,646,084 A | 2/1987 | Burrowes et al. | 340/870.03 |
| 4,686,460 A | 8/1987 | Stevens et al. | 324/142 |
| 4,692,874 A | 9/1987 | Mihara | 702/61 |
| 4,697,180 A | 9/1987 | Swanson | 340/870.02 |
| 4,700,280 A | 10/1987 | Onda et al. | 363/19 |
| 4,701,858 A | 10/1987 | Stokes et al. | 340/870.02 |
| 4,713,608 A | 12/1987 | Catiller et al. | 324/142 |
| 4,754,219 A | 6/1988 | Milkovic | 324/142 |
| 4,757,456 A | 7/1988 | Benghiat | 702/60 |
| 4,761,725 A | 8/1988 | Henze | 363/46 |
| 4,794,369 A | 12/1988 | Haferd | |
| 4,803,632 A | 2/1989 | Frew et al. | |
| 4,814,757 A | 3/1989 | Patterson et al. | 340/752 |
| 4,831,327 A | 5/1989 | Chenier et al. | 324/127 |
| 4,853,620 A | 8/1989 | Halder et al. | 324/142 |
| 4,862,493 A | 8/1989 | Venkataraman et al. | 340/870.02 |
| 4,866,587 A | 9/1989 | Wadlington | 363/16 |
| 4,881,027 A | 11/1989 | Joder et al. | 324/142 |
| 4,884,021 A | 11/1989 | Hammond et al. | 324/142 |
| 4,884,070 A | 11/1989 | Burrowes et al. | 340/870.02 |
| 4,884,211 A | 11/1989 | Hammond et al. | 324/142 |
| 4,896,106 A | 1/1990 | Voisine et al. | 324/142 |
| 4,902,964 A | 2/1990 | Szabela et al. | |
| 4,902,965 A | 2/1990 | Budrug et al. | 324/116 |
| 4,908,569 A | 3/1990 | Fest | 324/120 |
| 4,908,769 A | 3/1990 | Vaughon et al. | 324/142 |
| 4,922,187 A | 5/1990 | Beverly, II | 340/870.02 |
| 4,922,399 A | 5/1990 | Tsuzki | 363/21 |
| 4,931,725 A | 6/1990 | Hutt et al. | 324/142 |
| 4,949,029 A | 8/1990 | Cooper et al. | 324/74 |
| 4,951,052 A | 8/1990 | Jacob et al. | |
| 4,956,761 A | 9/1990 | Higashi | 363/19 |
| 4,975,592 A | 12/1990 | Hahn et al. | 363/38 |
| 4,977,368 A | 12/1990 | Munday et al. | |
| 4,978,911 A | 12/1990 | Perry et al. | 324/142 |
| 4,998,061 A | 3/1991 | Voisine et al. | 324/142 |
| 4,999,569 A | 3/1991 | Weikel | 324/74 |
| 5,010,335 A | 4/1991 | Coppola et al. | 340/870.28 |
| 5,014,213 A | 5/1991 | Edwards et al. | 364/483 |
| 5,017,860 A | 5/1991 | Germer et al. | 324/142 |
| 5,019,955 A | 5/1991 | Hoeksma | 363/21 |
| 5,032,785 A | 7/1991 | Mathis et al. | 324/107 |
| 5,059,896 A | 10/1991 | Germer et al. | 324/142 |
| 5,122,735 A | 6/1992 | Porter et al. | 324/142 |
| 5,140,511 A | 8/1992 | Lee et al. | 363/21 |
| 5,151,866 A | 9/1992 | Glaser et al. | 324/141 |
| 5,153,837 A | 10/1992 | Shaffer et al. | 364/464.04 |
| 5,173,657 A | 12/1992 | Holdsclaw | |
| 5,175,675 A | 12/1992 | Uramoto | 363/19 |
| 5,181,026 A | 1/1993 | Granville | 340/870.28 |
| 5,184,064 A | 2/1993 | Vicknair et al. | 324/156 |
| 5,229,713 A | 7/1993 | Bullock et al. | 324/142 |
| 5,245,275 A | 9/1993 | Germer et al. | 324/142 |
| 5,268,633 A | 12/1993 | Balch | 324/74 |
| 5,270,958 A | 12/1993 | Dastous | 364/569 |
| 5,287,287 A | 2/1994 | Chamberlain et al. | 364/483 |
| 5,296,803 A | 3/1994 | Kirby et al. | 324/156 |
| 5,315,527 A | 5/1994 | Beckwith | 364/483 |
| 5,325,051 A | 6/1994 | Germer et al. | 324/142 |
| 5,391,983 A | 2/1995 | Lusignan et al. | 324/142 |
| 5,457,621 A * | 10/1995 | Munday et al. | 363/56 |
| 5,495,167 A | 2/1996 | Cotroneo | 324/74 |
| 5,537,029 A * | 7/1996 | Hemminger et al. | 324/142 |
| 5,539,304 A | 7/1996 | Payne et al. | 324/74 |
| 5,544,089 A | 8/1996 | Hemminger et al. | 324/142 |
| 5,548,209 A | 8/1996 | Luisignan et al. | 324/142 |
| 5,548,527 A | 8/1996 | Hemminger et al. | 702/62 |
| 5,555,508 A * | 9/1996 | Munday et al. | 702/60 |
| 5,903,145 A | 5/1999 | Hemminger et al. | 324/142 |
| 6,229,295 B1 | 5/2001 | Hemminger et al. | 702/64 |

FOREIGN PATENT DOCUMENTS

| | | |
|---|---|---|
| EP | 0 462 045 | 12/1991 |
| GB | 2 095 879 | 1/1982 |
| GB | 2177 805 A | 1/1987 |
| JP | 61-11680 | 1/1986 |
| JP | 61-38569 | 2/1986 |
| JP | 61/284670 | 2/1986 |
| JP | 1-239473 | 9/1989 |
| JP | 1/239474 | 9/1989 |
| JP | 01/239475 | 9/1989 |
| WO | WO 86/05887 | 10/1986 |

OTHER PUBLICATIONS

Landis & Gyr, "Electronic Meter, Class 0,2; ZFRI, ZMRI", Jul. 1971.

Landis & Gyr, "Precision Solid–State Meters," Oct. 1988.

HP Eggenberger, "Ein Elektronischer Elektrizitätszähler für Wirk–und Blindverauch," *Neue Zürcher Zeitung*, Sep. 6, 1989, together with English Translation thereof.

H. Kohler, "Elektronischer Hochpräzisionszähler im 19–Zoll–Einbaugehäuse für Wirkverbrauch–und Blindverbrauchzühlung," *Siemens Magazine*, pp. 345–349, 1977.

Nilsen, "EMS 2100 Electricity Comsumption Analyser—Australian Design Award 1998," pp. 1–16.

Product Brochure: "KVI Polyphase Combination Meter", dated Jul., 1988.

Lester, G., "A Communications Protocol for Reading and Programming Electronic Metering Devices from hand Held Units", GEC Meters, U.K., Prior to Feb. 21, 1991.

P.R. Hutt, et al., "Design, Benefits and Flexibility in Intelligent Metering Technology", Polymeters Limited, U.K., Prior to Feb. 21, 1991.

G.A. Kingston, et al., "Multi Function Polyphase Metering—An Integrated Approach", Schlumberger Industries Electricity Management, U.K., Prior to Feb. 21, 1991.

In the Matter of Australian Patent Application 688711 in the name of ABB Power T&D Company Inc. and In the Matter of Opposition thereto by Electrowatt Technology Innovation Corporation, Statement of Grounds and Particulars in Support of Opposition, Aug. 12, 1998.

In the Matter of Australian Patent Application 688711 in the name of ABB Power T&D Company Inc. and In the Matter of Opposition thereto by Electrowatt Technology Innovation Corporation, Revised Statement of Grounds and Particulars in Support of Opposition, Feb. 19, 1999.

QUAD4® Plus Multifunction Electronic Meter, User's Guide, Document A–117350, Revision L, Process Systems, Charlotte, NC, 1993.

M. Schwendtner, et al., "Elektronischer Haushaltszähler" *Elektrontechnische Zeitschrift etz*, vol. 112, No. 6–7, 1991, pp. 320–323, together with an English translation of the same ("Electronic Domestic Meter").

Steven L. Garverick et al., "A Programmable Mixed–Signal ASIC of Power Metering," ISSCC91/Session 2/Low–Temperature Circuits and Special–Purpose Processors/Paper WP 2.4, IEEE International Solid–State Circuits Conference, 1991.

*Quantum Multi–Function Polyphase Meter* Type SQ400, Preliminary Instruction Manual Draft III, Mar. 1983.

ST–Q101 Series Electronic Meter, Product Bulletin 10253, Schlumberger Industries, 1988.

ST–Q200 Series System Measurement, Product Bulletin 10255, Schlumberger Industries, 1988.

*Quantum*™ *Technical Guide*, Jul. 1989.

ST–Q200 Series System Measurement, Product Bulletin 10255, Schlumberger Industries, 1990.

*Quantum® Electronic Meter Field Reference Manual For Q101, Q111, Q121 Q200, Q210, Q220 and Q230 Electronic Meters*, Schlumberger Industries, (date unknown).

*ST–MT100 Electronic Time–of–Use Instruction Manual 0505*, Sangamo Westing, Inc., May 1987.

*MT 100 Electronic–Time–of–Use Register Instruction Manual 0505*, Schlumberger Industries, Dec. 1991.

*ST–DS130 Recorder Module Production Bulletin 13157*, Schlumberger Industries, Sep. 1988.

Negahban, M. et al., "A DSP–based Watthour Meter," IEEE International Solid–State Circuits Conference. Digest of Technical Papers. 36th ISSC. 1st Ed., NY, NY USA, 15–17, Feb. 1989.

Usenko, V.V. et al., "Meter For Recording the Energy of Single and Rarely–Repeating Ultrahigh–Energy Pulses," Radiotekhnika, Kharkov, Ukrainian SSR, No. 86, pp. 44–48, 1988, 2 REF. [Article unobtainable; abstract only available].

Landis & Gyr Instruction/Technical Manual, Bulletin 920, First Printing 3/87.

Landis & Gyr, *ZMA110m402—Solid State Precision Meter IEC Class 1.0*.

Landis & Gyr, *Bulletin 930 SSM2 Instruction/Technical Manual Polyphase Solid State Meter*, Landis & Gyr, Lafayette, Indiana.

Landis & Gyr, *Bulletin 920 SSM Instruction/Technical Solid State Meter Class 20 Form 9S*, First Publication Mar. 1987.

McGrath, Donald T., *Signal Processing Considerations in Power Management Applications*, GE Corporate Research and Development, 1991.

"Three–Phase, Watt–Hour Meter IC," *Electronic Design*, Feb. 23, 1989.

Garverick, Steven L., et al., "A Programmable Mixed–Signal ASIC for Power Metering," *IEEE Journal of Solid–State Circuits*, vol. 26, No. 12, Dec. 1991.

Garverick, Steven L., et al., "A Programmable Mixed–Signal ASIC for Power Metering" *IEEE International Solid–State Circuits Conference*, 1991.

Summers, R., *Integrated Semiconductor Solutions for Metering and Telemetering Applications*, Texas Instruments, Apr. 1990.

Negahaban, M., *A DSP Based Watthour Meter*, Silicon Systems, Inc., Nov. 23, 1988.

"Enter the Electronic Metering Age With GE, The Electronic Polyphase Demand Meter, GE Electronic Metering," GE Meters Brochure, Somersworth, NH, Sep. 1989.

Su, Kendall L., "Fundamentals of Circuits, Electronics and Signal Analysis," Georgia Institute of Technology, Atlanta, GA, vol. 1, pp. 61–63, Dec. 1996.

Second Amended Complaint for Patent Infringement and for Declaratory Judgment of Non–Infringement, Invalidity and/or That Schlumberger is not Entitled to Relief, *ABB Automation, Inc., v. Schlumberger Resource Management Services, Inc.*, United States District Court for the District of Delaware, Case No.: 01–77 SLR.

Amended Answer and Affirmative Defenses to Second Amended Complaint and Counterclaims for Declaratory Judgment of Non–Infringement, Invalidity, and/or Unenforceability and for Patent Infringement, *ABB Automation, Inc., v. Schlumberger Resource Management Services, Inc.*, United States District Court for the District of Delaware, Case No.: 01–77 SLR.

Reply and Affirmative Defenses to Schlumberger's Amended–Counterclaims filed in Response to ABB's Second Amended Complaint, *ABB Automation, Inc., v. Schlumberger Resource Management Services, Inc.*, United States District Court for the District of Delaware, Case No.: 01–77 SLR.

\* cited by examiner

APPARATUS FOR METERING ELECTRICAL POWER AND ELECTRONICALLY COMMUNICATING ELECTRICAL POWER INFORMATION

RELATED APPLICATION DATA

This application is a continuation of U.S. patent application Ser. No. 08/479,013, filed Jun. 7, 1995, which is a continuation of U.S. patent application Ser. No. 07/839,634, filed Feb. 21, 1992, now U.S. Pat. No. 5,537,029.

FIELD OF INVENTION

The present invention relates generally to the field of electric utility meters. More particularly, the present invention relates to both electronic watthour meters and meters utilized to meter real and reactive energy in both the forward and reverse directions.

BACKGROUND OF THE INVENTION

Techniques and devices for metering the various forms of electrical energy are well known. Meters, such as utility power meters, can be of two types, namely, electromechanical based meters whose output is generated by a rotating disk and electronic based meters whose output component is generated electronically. A hybrid meter also exists, wherein an electronic register for providing an electronically generated display of metered electrical energy has been combined, usually optically, to a rotating disk. Pulses generated by the rotating disk, for example by light reflected from a spot painted on the disk, are utilized to generate an electronic output signal.

It will be appreciated that electronic meters have gained considerable acceptance due to their increasing reliability and extended ambient temperature ranges of operation. Consequently, various forms of electronic based meters have been proposed which are virtually free of any moving parts. In the last ten years several meters have been proposed which include a microprocessor.

Testing of electronic meters has always been a problem. A special mode of register operation known in the industry as the test mode has been available to ease register testing, however, little has been done to improve overall meter testing. Electronic meters have the potential of providing faster test times, multiple metering functions and calibration of the meter through software adjustment. However, implementing such functions can be expensive and complicated.

Presently, electric utility companies can test mechanical meters with a piece of test equipment which can reflect light off a metered disk to detect a painted spot as the disk rotates. An alternative form of testing mechanical meters is disclosed in U.S. Pat. No. 4,600,881—LaRocca et al. which describes the formation of a hole in the disk. A light sensitive device is placed in a fixed position on one side of the disk. As the disk rotates, and the hole passes over the light sensitive device, a pulse is provided indicating disk movement.

Since electronic meters preferably do not contain rotating disks, such simple testing techniques cannot be utilized. Consequently, a need exists for an electronic meter having a relatively simple means of testing the meter.

SUMMARY OF THE INVENTION

The previously described problem is resolved and other advantages are achieved in an apparatus for metering electrical power and electronically communicating electrical power information in accordance with sensed analog voltage and current signals. The apparatus comprises a first processor which receives the analog voltage and current signals and converts the analog voltage and current signals to digital voltage and current signals, a second processor which receives a metering signal and outputs at least one output signal based on the metering signal, and an output device which receives the at least one output signal and communicates the electrical power information external to the apparatus in a format specific to the output device.

The first processor determines at least one type of metered power based on the digital voltage and current signals and outputs the metering signal representative of the at least one type of metered power to the second processor. Additionally, the at least one type of metered power may comprise real power, reactive power, and apparent power. Still further, the first processor may receive plural phases of analog voltage and current signals, at least two of the plural phases being input to respective analog to digital converters to be converted into the digital voltage and current signals.

In accordance with a feature of the present invention, the output device comprises a display having a plurality of visible annunciators, and the at least one output signal comprises a display signal generated by the second processor to selectively activate the visible annunciators. The metering signal may be representative of a direction and rate of power flow and the display signal may be representative of the direction, such that the display signal selectively activates the visible annunciators to indicate the rate and direction of power flow. Further, the visible annunciators may be selectively activated such that rotation of a disk is mimicked and positioned on the display such that the rate of the power flow, the rate of disk rotation and the direction of power flow can be concurrently displayed. At least one of the plurality of visible annunciators may be activated at the rate of power flow based on a unit of power of the at least one type of metered power, such as the $K_h$ value of the apparatus. The display may additionally alternately display a plurality of metered powered types in accordance with the display signal output by the second processor. It may also be preferable to display all visible annunciators in response to the display signal, and the display may comprise a liquid crystal display.

In accordance with another feature of the present invention, the output device comprises an optical port and the at least one output signal comprises an asynchronous communication signal, such that the optical port transmits information by converting the asynchronous communication signal to a predetermined wavelength of light. The optical port is adapted to receive and convert the predetermined wavelength of light to the asynchronous communication signal, and the second processor is capable of receiving commands input to the optical port via the serial asynchronous communication signal. In addition, the second processor selects the at least one type of metered power from a plurality of types of metered power such that different metered power types can be transmitted from the optical port at different times based on a control signal received by the optical port. The metering signal may be further representative of a direction and rate of power flow and the asynchronous communication signal and the information transmitted by the optical port is further representative of the rate of power flow. Additionally, the second processor may select a plurality of types of metered power and multiplex the plurality of metered power types over the optical port such that the plurality of types of metered power are transmitted by the optical power. Still further, the second processor may acknowledge an input from the optical port by echoing the input, wherein the input places second processor into a condition to receive additional data from the optical port, and the second processor may be programmable using the optical port.

According to yet another feature of the present invention, the output device comprises an option connector and the at least one output signal comprises a serial communications signal. The option connector is adapted to receive the serial communication signal, and the second processor is capable receiving commands input to the option connector.

In accordance with another aspect of the present invention, there is provided an apparatus for metering electrical power and electronically communicating electrical power information, where the electrical power comprises voltage and current characteristics determined in accordance with sensed analog voltage and current signals. The apparatus comprises a first processor which receives the analog voltage and current signals and converts the analog voltage and current signals to digital voltage and current signals, a second processor which receives a metering signal and outputs at least one output signal based on the metering signal, a non-volatile memory which stores configuration information, and an output device which receives the at least one output signal and communicates the electrical power information external to the apparatus in a format specific to the output device. The first processor determines at least one type of metered power based on the digital voltage and current signals and outputs the metering signal representative of the at least one type of metered power. The first processor and the second processor determine the at least one type of metered power in accordance with the configuration information stored in the non-volatile memory.

According to a feature of the invention, the output device comprises a display having visible annunciators, wherein one of the visible annunciators is made visible at the rate determined in accordance with a unit of power of the at least one type of metered power, and the rate is a predetermined fraction of the unit of power and is set in accordance with the configuration information.

BRIEF DESCRIPTION OF THE DRAWINGS

The present invention will be better understood, and its numerous objects and advantages will become apparent to those skilled in the art by reference to the following detailed description of the invention when taken in conjunction with the following drawings, in which.

DETAILED DESCRIPTION

Figure 1:
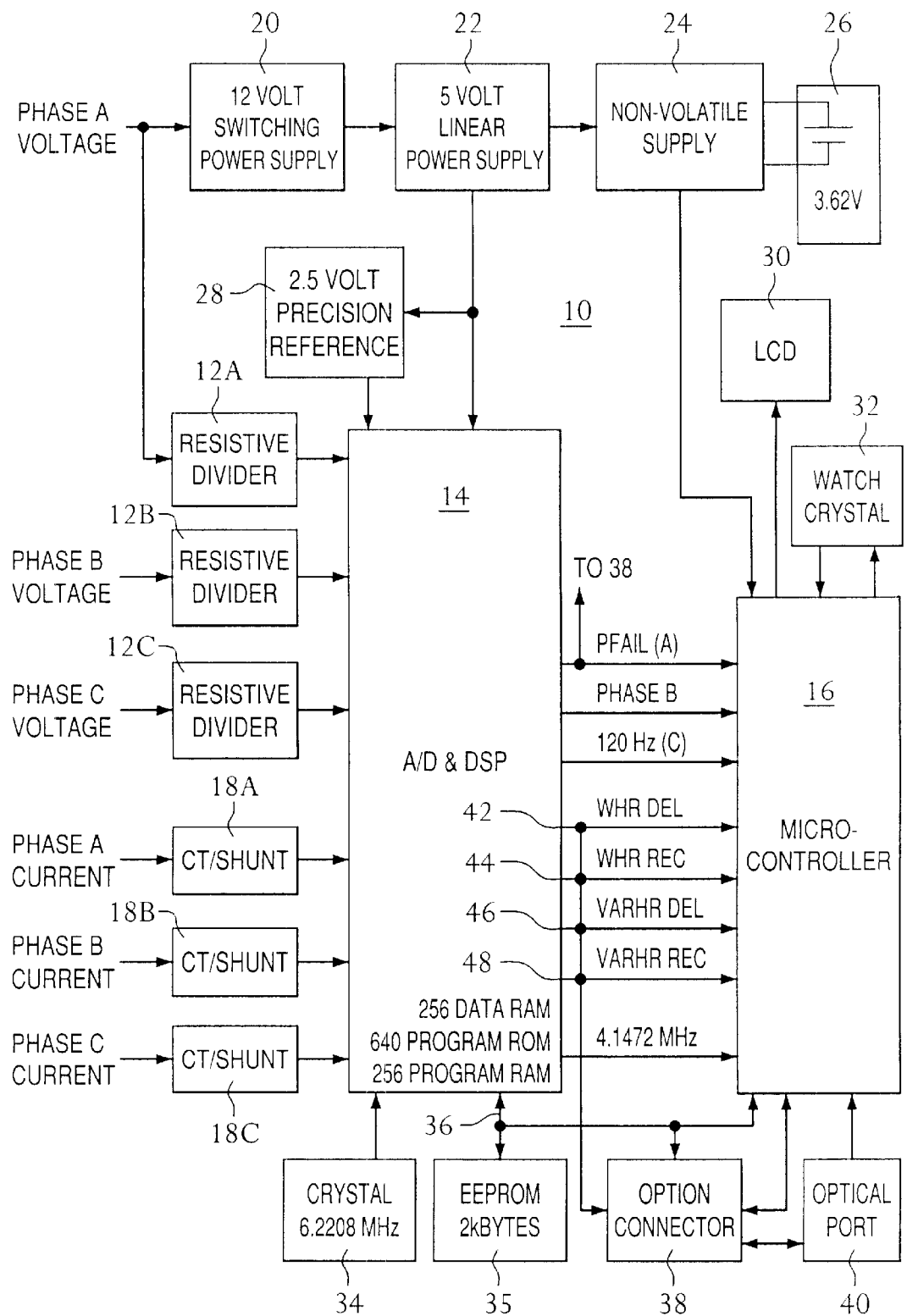
FIG. 1 is a block diagram of an electronic meter constructed in accordance with the present invention.
Figure 2A:
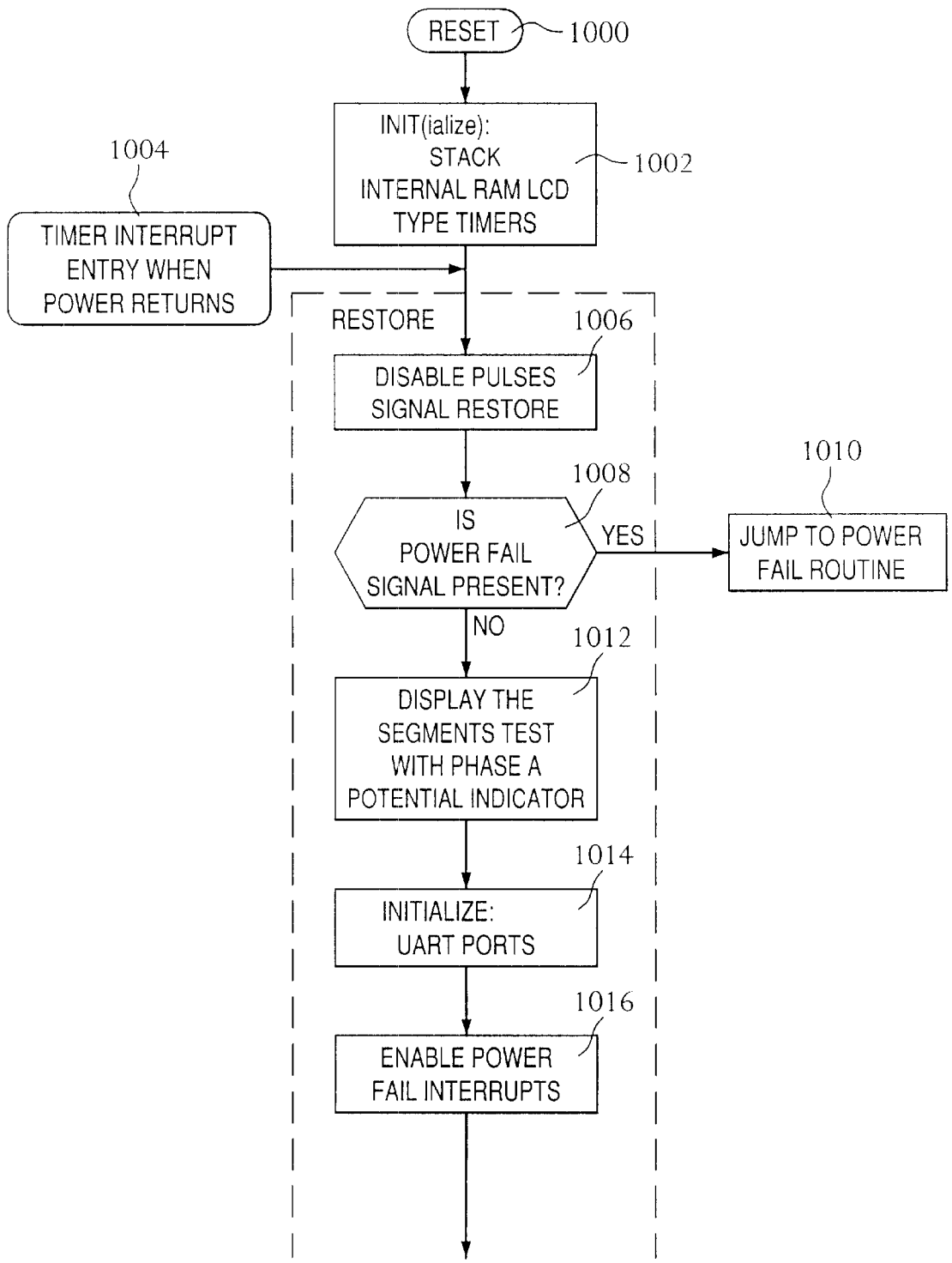
FIGS. 2A–2E combine to provide a flow chart of the primary program utilized by the microcontroller disclosed in FIG. 1.
Figure 2B:
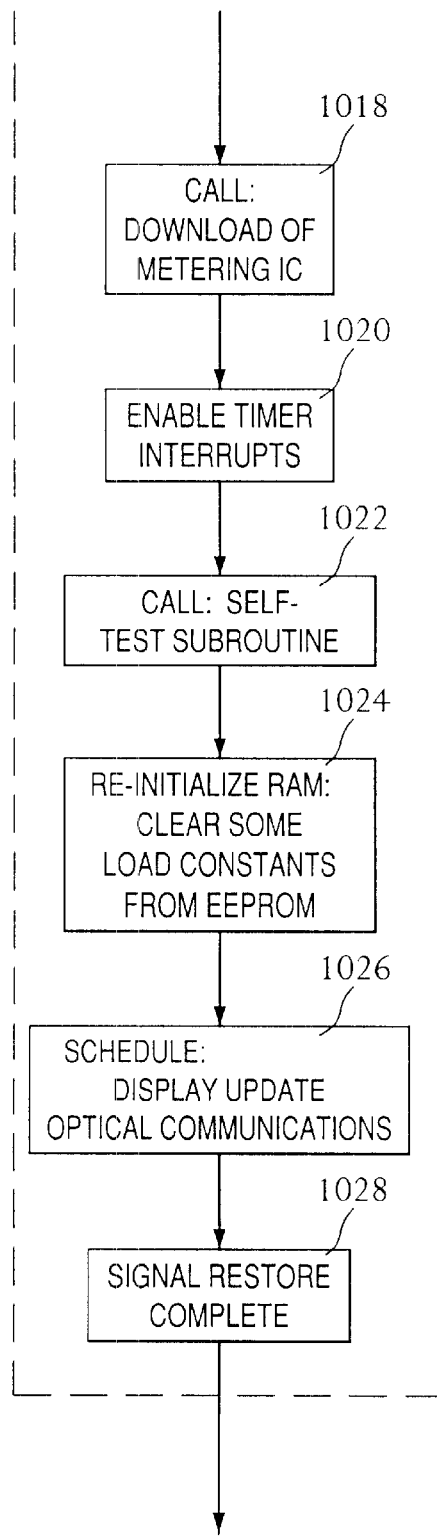
Figure 2C:
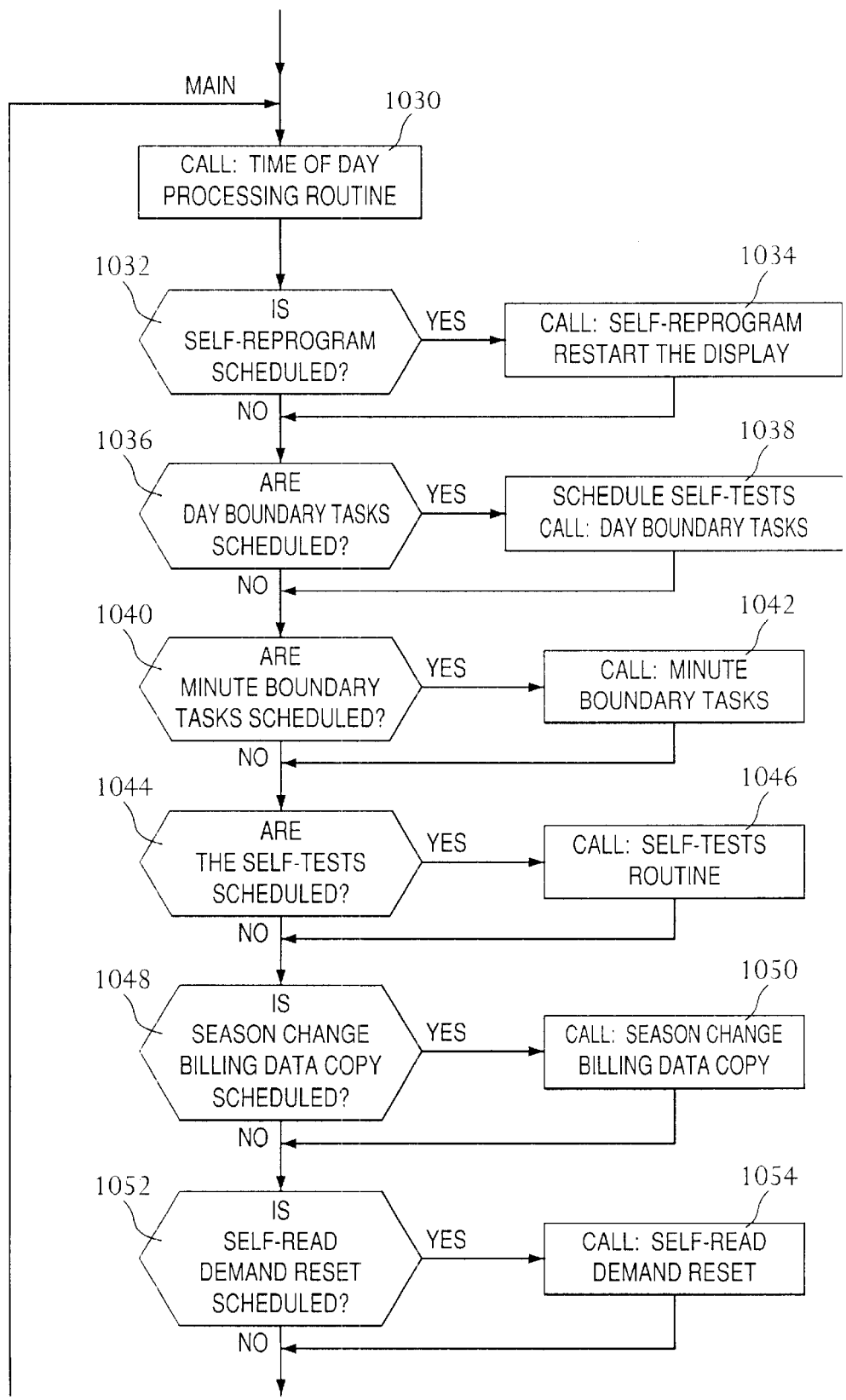
Figure 2D:
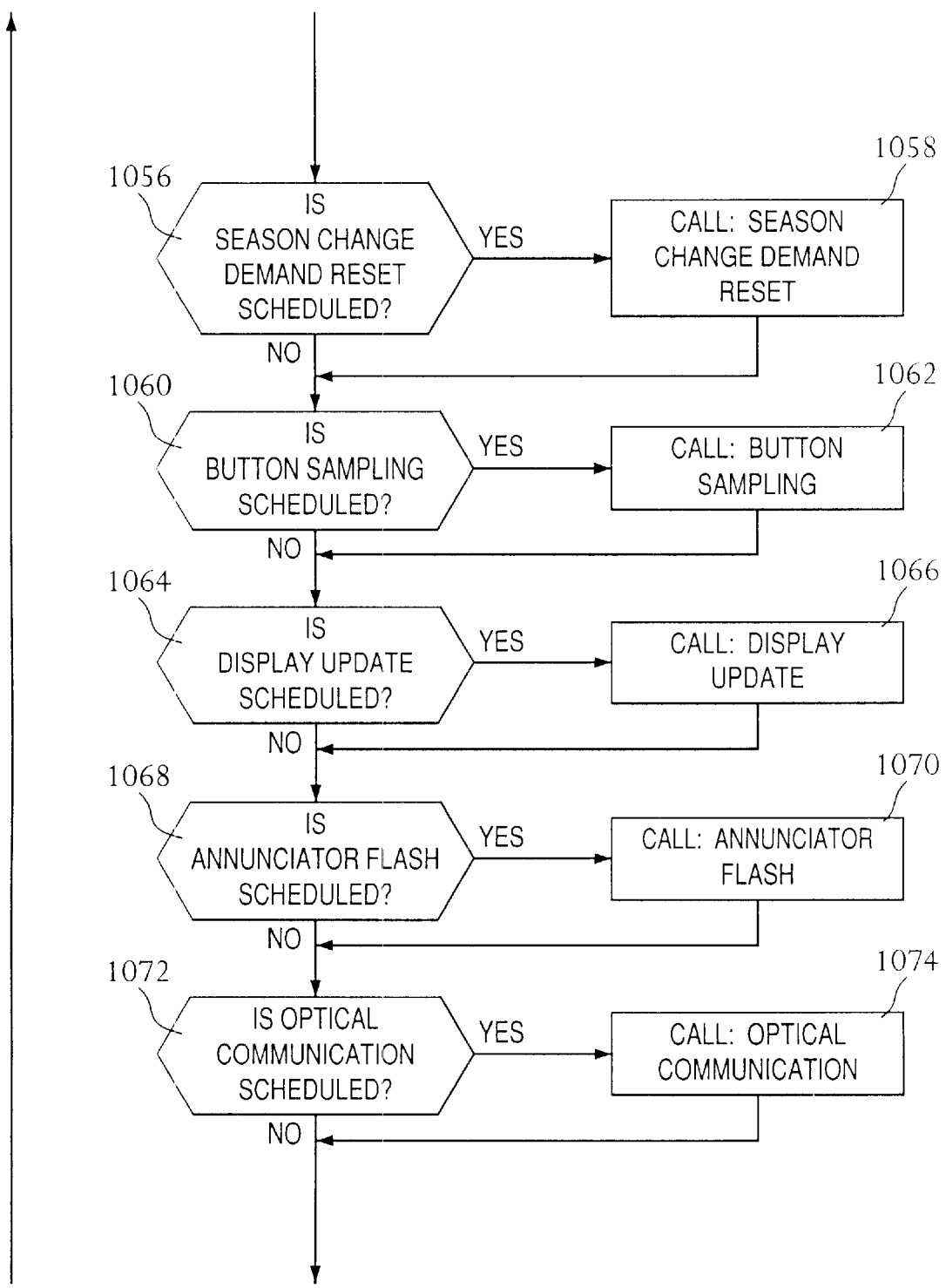
Figure 2E:
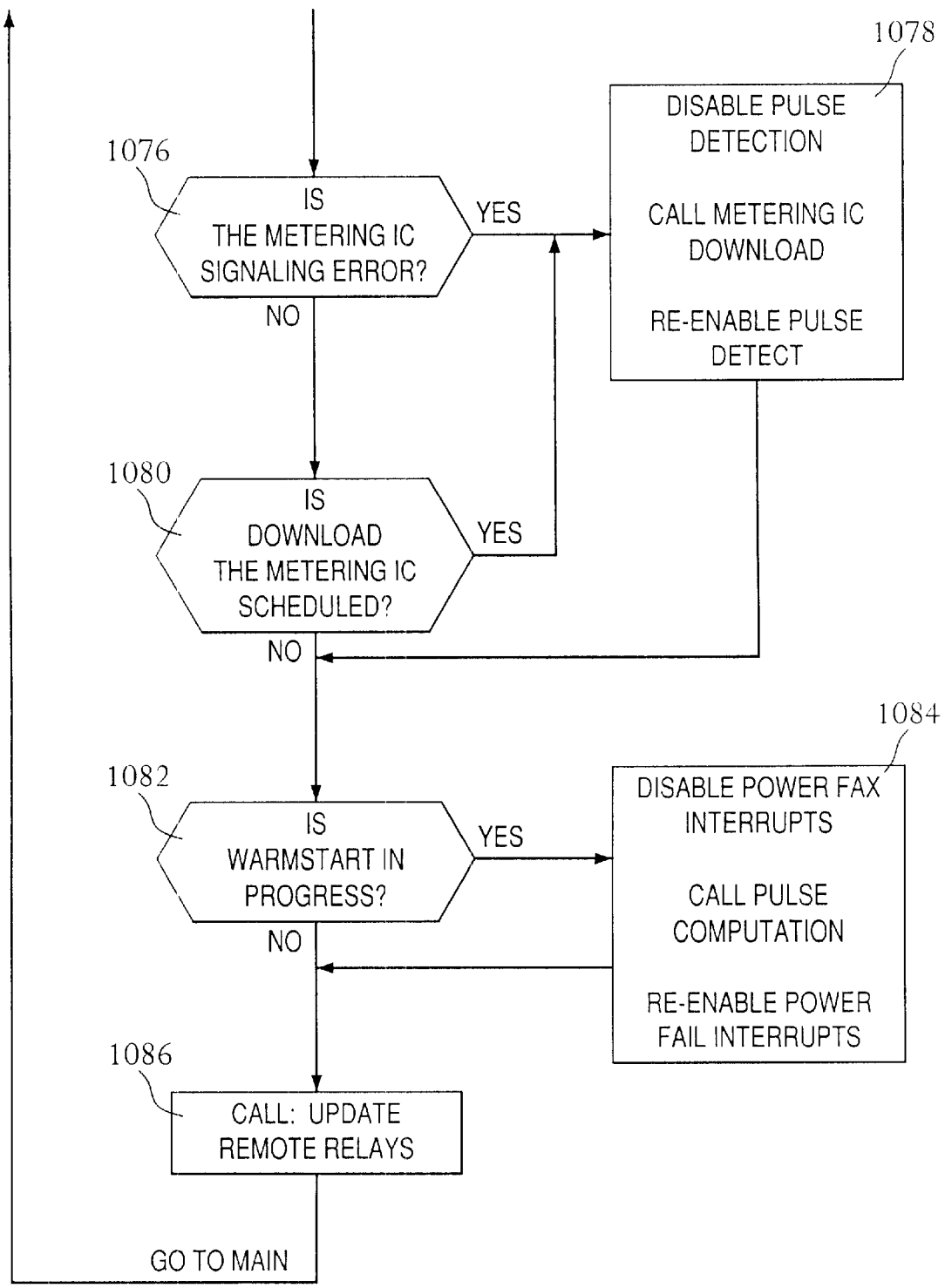

A new and novel meter for metering electrical energy is shown in FIG. 1 and generally designated 10. It is noted at the outset that this meter is constructed so that the future implementation of higher level metering functions can be supported.

Meter 10 is shown to include three resistive voltage divider networks 12A, 12B, 12C; a first processor—an ADC/DSP (analog-to-digital converter/digital signal processor) chip 14; a second processor—a microcontroller 16 which in the preferred embodiment is a Mitsubishi Model 50428 microcontroller; three current sensors 18A, 18B, 18C; a 12V switching power supply 20 that is capable of receiving inputs in the range of 96–528V; a 5V linear power supply 22; a non-volatile power supply 24 that switches to a battery 26 when 5V supply 22 is inoperative; a 2.5V precision voltage reference 28; a liquid crystal display (LCD) 30; a 32.768 kHz oscillator 32; a 6.2208 MHz oscillator 34 that provides timing signals to chip 14 and whose signal is divided by 1.5 to provide a 4.1472 MHz clock signal to microcontroller 16; a 2 kbyte EEPROM 35; a serial communications line 36; an option connector 38; and an optical communications port 40 that may be used to read the meter. The inter-relationship and specific details of each of these components is set out more fully below.

It will be appreciated that electrical energy has both voltage and current characteristics. In relation to meter 10 voltage signals are provided to resistive dividers 12A–12C and current signals are induced in a current transformer (CT) and shunted. The output of CT/shunt combinations 18A–18C is used to determine electrical energy.

First processor 14 is connected to receive the voltage and current signals provided by dividers 12A–12C and shunts 18A–18C. As will be explained in greater detail below, processor 14 converts the voltage and current signals to voltage and current digital signals, determines electrical energy from the voltage and current digital signals and generates an energy signal representative of the electrical energy determination. Processor 14 will always generate watthour delivered (Whr Del) and watthour received (Whr Rec) signals, and depending on the type of energy being metered, will generate either volt amp reactive hour delivered (VARhr Del)/volt amp reactive hour received (VARhr Rec) signals or volt amp hour delivered (VAhr Del)/volt amp hour received (VAhr Rec) signals. In the preferred embodiment, each transition on conductors 42–48 (each transition from logic low to logic high and vice versa) is representative of the measurement of a unit of energy. Second processor 16 is connected to first processor 14. As will be explained in greater detail below, processor 16 receives the energy signal(s) and generates an indication signal representative of the energy signal(s).

In relation to the preferred embodiment of meter 10, currents and voltages are sensed using conventional current transformers (CT's) and resistive voltage dividers, respectively. The appropriate multiplication is accomplished in a new integrated circuit, i.e. processor 14. Although described in greater detail in relation to FIG. 1, processor 14 is essentially a programmable digital signal processor (DSP)

with built in analog to digital (A/D) converters. The converters are capable of sampling three input channels simultaneously at 2400 Hz each with a resolution of 21 bits and then the integral DSP performs various calculations on the results.

Meter 10 can be operated as either a demand meter or as a so-called time of use (TOU) meter. It will be recognized that TOU meters are becoming increasingly popular due to the greater differentiation by which electrical energy is billed. For example, electrical energy metered during peak hours will be billed differently than electrical energy billed during non-peak hours. As will be explained in greater detail below, first processor 14 determines units of electrical energy while processor 16, in the TOU mode, qualifies such energy units in relation to the time such units were determined, i.e. the season as well as the time of day.

All indicators and test features are brought out through the face of meter 10, either on LCD 30 or through optical communications port 40. Power supply 20 for the electronics is a switching power supply feeding low voltage linear supply 22. Such an approach allows a wide operating voltage range for meter 10.

In the preferred embodiment of the present invention, the so-called standard meter components and register electronics are for the first time all located on a single printed circuit board (not shown) defined as an electronics assembly. This electronics assembly houses power supplies 20, 22, 24 and 28, resistive dividers 12A–12C for all three phases, the shunt resistor portion of 18A–18C; oscillator 34, processor 14, processor 16, reset circuitry (not shown), EEPROM 35, oscillator 32, optical port components 40, LCD 30, and an option board interface 38. When this assembly is used for demand metering, the billing data is stored in EEPROM 35. This same assembly is used for TOU metering applications by merely utilizing battery 26 and reprogramming the configuration data in EEPROM 35.

Consider now the various components of meter 10 in greater detail. Primary current being metered is sensed using conventional current transformers. It is preferred for the current transformer portion of devices 18A–18C have tight ratio error and phase shift specifications in order to limit the factors affecting the calibration of the meter to the electronics assembly itself. Such a limitation tends to enhance the ease with which meter 10 may be programmed. The shunt resistor portion of devices 18A–18C are located on the electronics assembly described above and are preferably metal film resistors with a maximum temperature coefficient of 25 ppm/° C.

The phase voltages are brought directly to the electronic assembly where resistive dividers 12A–12C scale these inputs to processor 14. In the preferred embodiment, the electronic components are referenced to the vector sum of each line voltage for three wire delta systems and to earth ground for all other services. Resistive division is used to divide the input voltage so that a very linear voltage with minimal phase shift over a wide dynamic range can be obtained. This in combination with a switching power supply allows the wide voltage operating range to be implemented.

Figure 7:
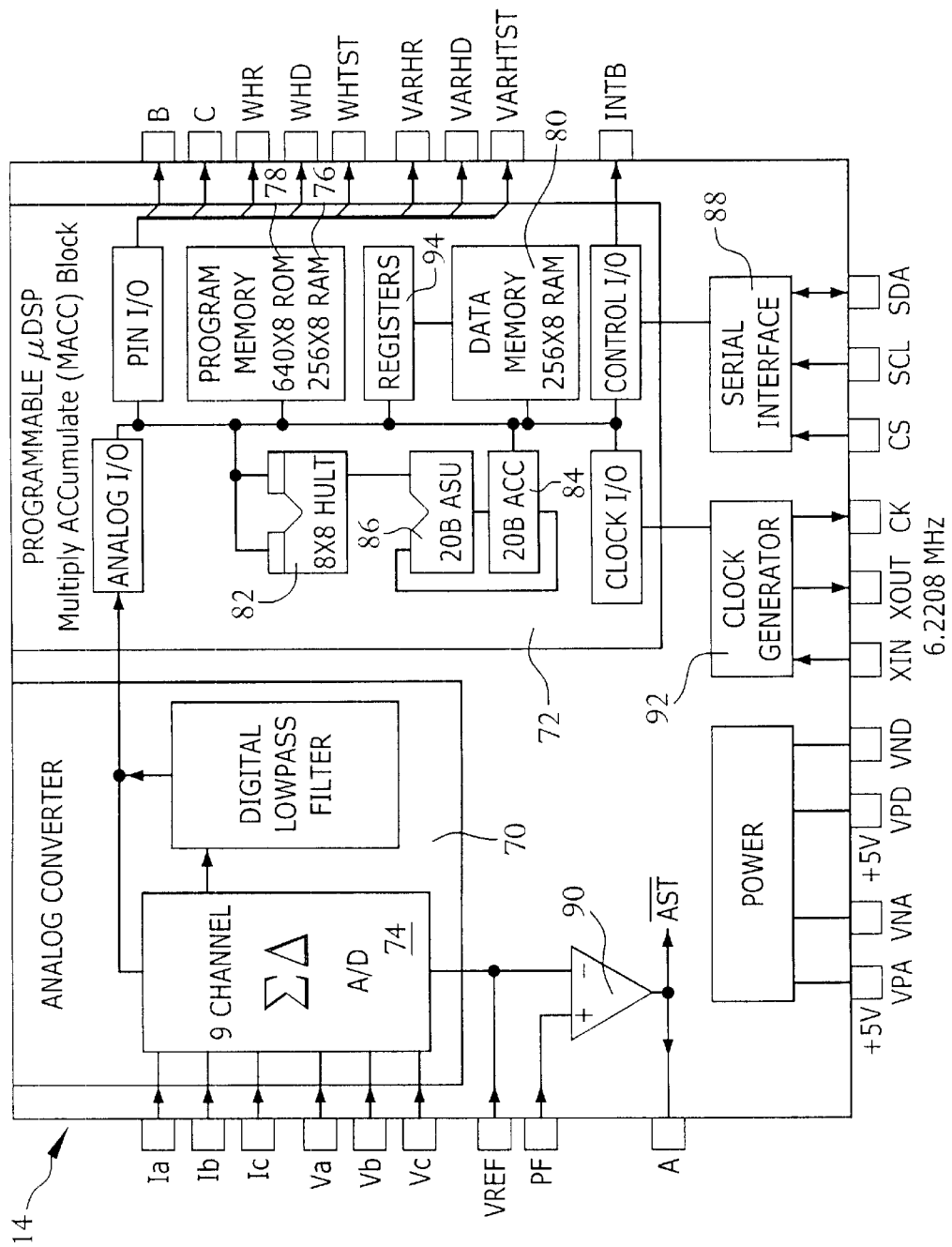
FIG. 7 is a block diagram of the A/D&DSP processor shown in FIG. 1.

It will be appreciated that energy units are calculated primarily from multiplication of voltage and current. The specific formulae utilized in the preferred embodiment, are described in greater detail in U.S. Pat. No. 5,555,508, which is incorporated herein by reference. However, for purposes of FIG. 1, such formulae are performed in processor 14. Referring now to FIG. 7, processor 14 includes an analog converter 70 and a programmable DSP 72. Converter 70 includes, three three-channel, over-sampled, 2nd order, sigma-delta A/D converters, depicted as a 9 channel $\Sigma\Delta$ analog-to-digital converter 74. The 6.2208 MHz clock signal is divided by 3 such that each A/D samples its input at 2.0736 MHz. Each A/D performs a 96:1 reduction or averaging for each input that results in an effective sample rate of 2.4 kHz on each of the three inputs per A/D. The resolution of these samples is equivalent to 21 bits, plus sign. It is noted that such a $\Sigma\Delta$ analog-to-digital conversion scheme results in a correct convergence by each A/D for each sample converted. It is recognized that the bandwidth for such a conversion scheme is relatively small, however, the frequency of the voltage and current being converted is also relatively small.

In the preferred embodiment, the three voltage inputs, Va, Vb and Vc are sampled by one of the A/D's and the three current inputs Ia, Ib and Ic are sampled by a second A/D. The third A/D is used to sample either the voltage or current input of the B phase. Such sampling of the voltage or current input of the B phase is done because so-called 2½ element meters require the combination of the B phase current with one or both of the other phase currents. In addition, so-called two element meters require the B phase voltage to be combined with the other phase voltages to produce the line to line voltage. Having a third A/D enables these terms to be sampled simultaneously, thereby improving the measurement accuracy. This also improves the signal to noise ratio within processor 14.

DSP 72 is a reduced instruction set processor (RISC) which computes the desired energy quantities from the converted voltage and current samples. DSP 72 is shown to include a random access memory (RAM) memory 76 having a capacity of 256 bytes of data. Memory 76 is used to store computations and the subroutine stack. A read only memory (ROM) 78 is also shown and has a capacity of 640 bytes of data. Memory 78 is used to store those metering subroutines common to all energy calculation. Another RAM memory 80 is depicted and has a capacity of 256 bytes of data. Memory 80 is used to store the main line program and specialized subroutines of DSP 72.

DSP 72 is also shown to include multiplier 82 and an accumulator 84 for processing the voltage and current digital signals thereby generating electrical energy information. There is also included arithmetic subtraction unit 86 interposed between multiplier 82 and accumulator 84.

From the foregoing, it should be appreciated that program ROM, i.e. memory 76 is defined at the oxide via level. As this defining step occurs relatively late in the manufacturing process for processor 14, changes can be made to such programming with minimal effort.

Calibration constants for each phase and certain potential linearization constants are stored in memory 80. Memories 76 and 80 are serially down-loaded from EEPROM 35 by microcontroller 16 on power-up of meter 10. Such an embodiment allows the benefit of being able to provide various meter forms economically, to calibrate without hardware modification, and permits the future addition of metering VAR or VA based on the per phase Vrms and Irms. The formulae for such operations are included in Table 1. Furthermore, the calculation of future, yet undefined, complex metering quantities could be obtained by merely reprogramming processor 14.

Processor 14 also contains a crystal oscillator (not shown), serial interface 88, power fail detect circuitry 90, and potential present outputs B and C. The crystal oscillator requires an external 6.2208 MHz crystal oscillator 34. Processor 14 uses this frequency directly for driving the DSP and indirectly for the A/D sampling. This frequency is also operated upon by clock generator 92 which serves to divide the output of oscillator 34 (input to processor 14 at XIN and XOUT) by 1.5, to buffer the divided clock signal and to output the divided clock signal at CK to processor 16 as its clock. This clock output is specified to work down to a supply voltage of 2.0 VDC.

Serial interface 88 is a derivation of the Signetics IIC bus. One serial address is assigned to processor 14. This address accesses one of the four DSP control registers. All information must pass through DSP data register 94 after writing the DSP address register. All memory, registers, and outputs of processor 14 can be read serially. A chip select line CS has been added to disable the communications buffer. The input CS is connected to and controlled by processor 16.

Power fail detection circuit 90 is a comparator which compares a divided representation of the supply voltage to a precision reference. The comparator's output at A concurrently provides a power fail signal and an indication of the presence of A phase voltage. Upon power fail, it is preferable to reset processor 14. In such a situation, the output pins Whr, Whd, etc. are forced to logic low voltage levels. Additionally, processor 14 goes into a lower power mode to reduce the current draw on power supply 20. In this lower power mode the comparator and oscillator operation are not affected, but DSP 72 ceases to operate.

The power failure voltage PF is generated by dividing the output of supply 22 to generate a voltage which is slightly greater than 2.5V. In the preferred embodiment, a resistor voltage divider provides PF. Since PF is generated in relation to the Phase A voltage (FIG. 1), its presence is an indication that the Phase A voltage is also present.

Consider again processor 14 as shown in FIG. 7. The phase B and C potential indicators outputs are under control of DSP 72. The B output is normally a logic level output. The C output also provides the power line time base function (note that phase C is present in all applications). To minimize noise at the power line fundamental, this time base is at two times the power line fundamental.

TABLE 1

Meter Formulae

Watt formulae $-3$: Watts $= K_G(K_A V_{A_0} I_{A_0} + K_B V_{B_1} I_{B_1} + D_C V_{C_2} I_{C_2})$
$-2$: Watts $= K_G((K_A V_{A_0} - K_B V_{B_0}) I_{A_0} + (K_C V_{C_2} - K_D V_{B_2}) I_{C_2})$
$-8$: Watts $= K_G(K_A V_{A_0} I_{A_0} - (K_B V_{A_0} I_{B_0} + K_D V_{C_2} I_{B_2}) + K_C V_{C_2} I_{C_2})$
$-7$: Watts $= K_G(K_A V_{A_0} I_{A_0} - K_B V_{A_0} I_{B_0} + + K_C V_{C_2} I_{C_2})$ NOTE: Subscripts refer to the phase of the inputs. Sub-subscripts refer to the A/D cycle in which the sample is taken. Va for −7 applications is actually line to neutral.

VA Formulae $-3$: VA $= K_G(K_A V_{A_0 \text{rms}} I_{A_0 \text{rms}} + K_B V_{B_1 \text{rms}} I_{B_1 \text{rms}} + K_C V_{C_2 \text{rms}} I_{C_2 \text{rms}})$
$-2$: VA $= K_G((K_A V_{A_0} - K_B V_{B_0})_{\text{rms}} I_{A_0 \text{rms}} + (K_C V_{C_2} - K_D V_{B_2})_{\text{rms}} I_{C_2 \text{rms}})$ $$-8: \text{VA} = K_G \left( K_A V_{A_0 \text{rms}} I_{A_0 \text{rms}} + \frac{(K_B V_{A_0 \text{rms}} + K_d V_{C_0 \text{rms}})}{2} I_{B_0 \text{rms}} + K_C V_{C_2 \text{rms}} I_{C_2 \text{rms}} \right)$$

$-7$: VA $= K_G(K_A V_{A_0 \text{rms}} I_{A \text{rms}} + K_B V_{A_0 \text{rms}} I_{B_0 \text{rms}} + K_C V_{C_2 \text{rms}} I_{C_2 \text{rms}})$ RMS measurements are made over one line cycle and preferably begin at the zero crossing of each voltage.

TABLE 1-continued

Meter Formulae

VAR Formula $$\text{VAR} = \sqrt{VA_A^2 - \text{Watt}_A^2} + \sqrt{VA_B^2 - \text{Watt}_B^2} + \sqrt{VA_C^2 - \text{Watt}_C^2}$$

where the subscripts are associated with the I terms of Watts and VAs and the calculation is performed every cycle as shown below:

$$-3: \text{VAR} = K_G \left( K_A \sqrt{(V_{A_0 \text{rms}} I_{A_0 \text{rms}})^2 - \left(\sum_{\text{zero}}^{\text{cycle}} V_{A_0} I_{A_0}\right)^2} + K_B \sqrt{(V_{B_1 \text{rms}} I_{B_1 \text{rms}})^2 - \left(\sum_{\text{zero}}^{\text{cycle}} V_{B_1} I_{B_1}\right)^2} + K_C \sqrt{(V_{C_2 \text{rms}} I_{C_2 \text{rms}})^2 - \left(\sum_{\text{zero}}^{\text{cycle}} V_{C_2} I_{C_2}\right)^2} \right)$$

$$-2: \text{VAR} = K_G \left( \sqrt{((K_A V_{A_0} - K_B V_{B_0})_{\text{rms}} I_{A_0 \text{rms}})^2 - \left(\sum_{\text{zero}}^{\text{cycle}} (K_A V_{A_0} - K_B V_{B_0}) I_{A_0}\right)^2} + \sqrt{((K_C V_{C_2} - K_D V_{B_2})_{\text{rms}} I_{C_2 \text{rms}})^2 - \left(\sum_{\text{zero}}^{\text{cycle}} (K_C V_{C_2} - K_D V_{B_2}) I_{C_2}\right)^2} \right)$$

$$-8: \text{VAR} = K_G \left( K_A \sqrt{(V_{A_0 \text{rms}} I_{A_0 \text{rms}})^2 - \left(\sum_{\text{zero}}^{\text{cycle}} V_{A_0} I_{A_0}\right)^2} + \sqrt{\left(\frac{1}{2}(K_B V_{A_0 \text{rms}} + K_D V_{C_2 \text{rms}}) I_{B_0 \text{rms}}\right)^2 - \left(\sum_{\text{zero}}^{\text{cycle}} (K_B V_{A_0} I_{B_0} + K_D V_{C_2} I_{B_2})\right)^2} + K_C \sqrt{(V_{C_2 \text{rms}} I_{C_2 \text{rms}})^2 - \left(\sum_{\text{zero}}^{\text{cycle}} V_{C_2} I_{C_2}\right)^2} \right)$$

$$-7: \text{VAR} = K_G \left( K_A \sqrt{(V_{A_0 \text{rms}} I_{A_0 \text{rms}})^2 - \left(\sum_{\text{zero}}^{\text{cycle}} V_{A_0} I_{A_0}\right)^2} + K_B \sqrt{(V_{A_0 \text{rms}} I_{B_0 \text{rms}})^2 - \left(\sum_{\text{zero}}^{\text{cycle}} V_{A_0} I_{B_0}\right)^2} + K_C \sqrt{(V_{C_2 \text{rms}} I_{C_2 \text{rms}})^2 - \left(\sum_{\text{zero}}^{\text{cycle}} V_{C_2} I_{C_2}\right)^2} \right)$$

For purposes of the above formulae, the following definitions apply:

−2 means a 2 element in 3 wire delta application;

−3 means a 3 element in 4 wire wye application;

−8 means a 2½ element in 4 wire wye application;

−5 means a 2 element in 3 wire delta application;

−7 is a 2½ element in 4 wire delta application.

Figure 8:
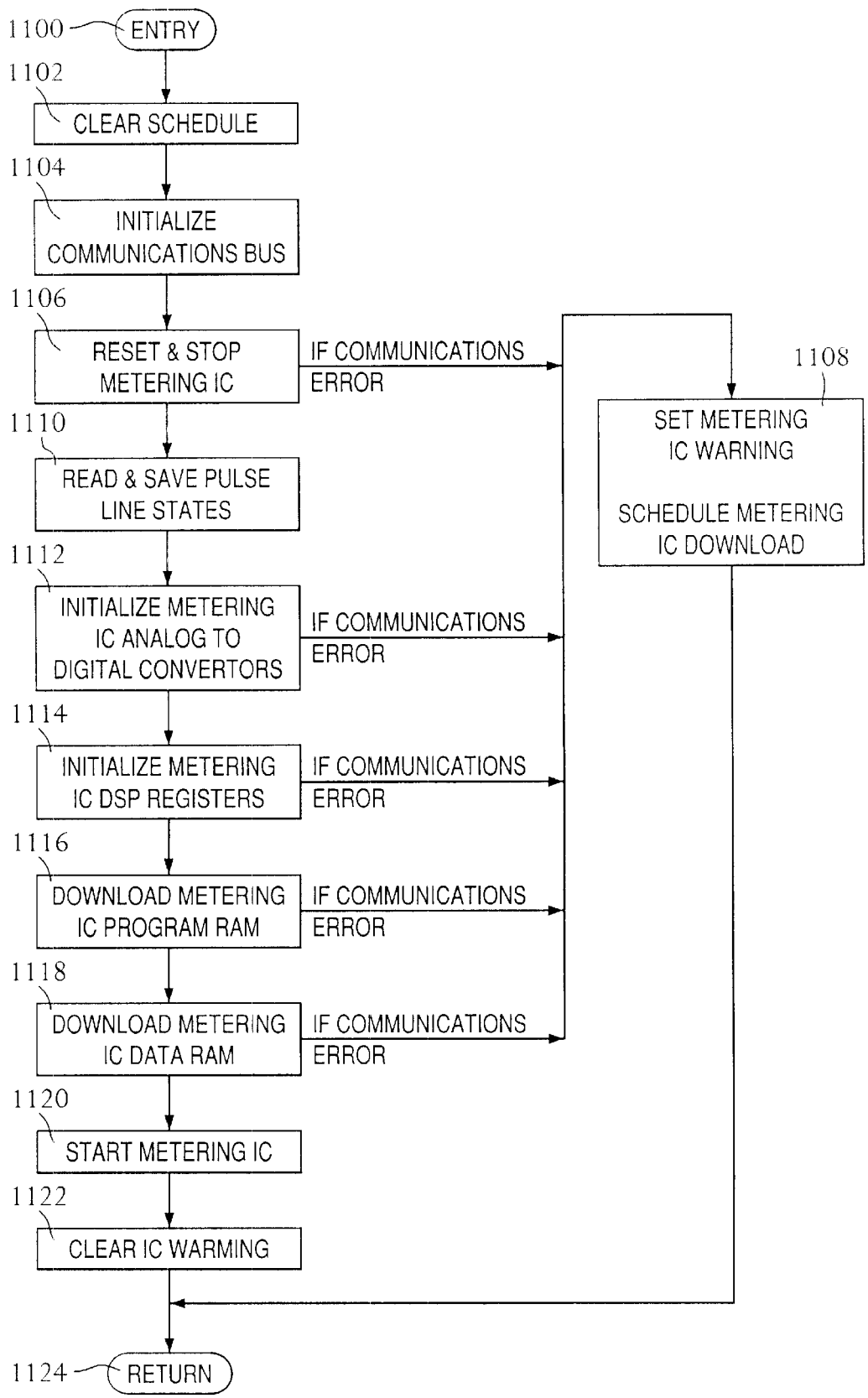
FIG. 8 is a flow chart of the download program utilized by the microcontroller shown in FIG. 1.

Referring now to FIG. 8, the program for downloading processor 14 will be described. At 1100, microcontroller 16 enters the program. At 1102, the schedule indicating that a metering download should take place is cleared. At 1104, Microcontroller 16 initializes the communication bus, which in the preferred embodiment is INTB. At 1106, microcontroller 16 resets and stops processor by way of an interrupt on processor 14. However, if there is a communications error between microcontroller 16 and processor 14, microcontroller 16 at 1108 sets a warning and schedules a download of processor 14. After 1108 the downloading program is terminated, microcontroller 16 returns to the main routine. At 1110, microcontroller reads and saves the pulse line states. It will be recalled that as processor 14 makes energy determinations, each unit of energy is represented by a logic transition on outputs 42–48 (FIG. 1). At 1110 the state of each output 42–48 is saved. At 1112, microcontroller initializes A/D converters 74, if a communication error occurs, microcontroller proceeds to 1108. At 1114 the digital signal processing registers 94 are initialized. At 1116 program memory 78 is downloaded to memory. At 1118, the data memory 80 is downloaded to memory. At 1120, processor 14 is started. If a communication error occurs at any of steps 1114–1120, microcontroller 16 again returns to 1108. At 1122, any warning messages previously set at 1108 are cleared. At 1124, microcontroller 16 returns to its main program.

The M37428 microcontroller 16 is a 6502 (a traditional 8 bit microprocessor) derivative with an expanded instruction set for bit test and manipulation. This microcontroller includes substantial functionality including internal LCD drivers (128 quadraplexed segments), 8 kbytes of ROM, 384 bytes of RAM, a full duplex hardware UART, 5 timers, dual clock inputs (32.768 kHz and up to 8 MHz), and a low power operating mode.

During normal operation, processor 16 receives the 4.1472 MHz clock from processor 14 as described above. Such a clock signal translates to a 1.0368 MHz cycle time. Upon power fail, processor 16 shifts to the 32.768 KHz crystal oscillator 32. This allows low power operation with a cycle time of 16.384 kHz. During a power failure, processor 16 keeps track of time by counting seconds and rippling the time forward. Once processor 16 has rippled the time forward, a WIT instruction is executed which places the unit in a mode where only the 32.768 kHz oscillator and the timers are operational. While in this mode a timer is setup to "wake up" processor 16 every 32,768 cycles to count a second.

Consider now the particulars of the power supplies shown in FIG. 1. As indicated previously, the off-line switching supply 20 is designed to operate over a 96–528 VAC input range. It connects directly to the Phase A voltage alternating current (AC) line and requires no line frequency transformer. A flyback converter serves as the basis of the circuit. A flyback converter is a type of switching power supply.

As used herein, the "AC cycle" refers to the 60 Hz or 50 Hz input to power supply 20. The "switching cycle" refers to the 50 kHz to 140 kHz frequency at which the switching transformer of power supply 20 operates. It will be noted that other switching cycle frequencies can be used.

Figure 9:
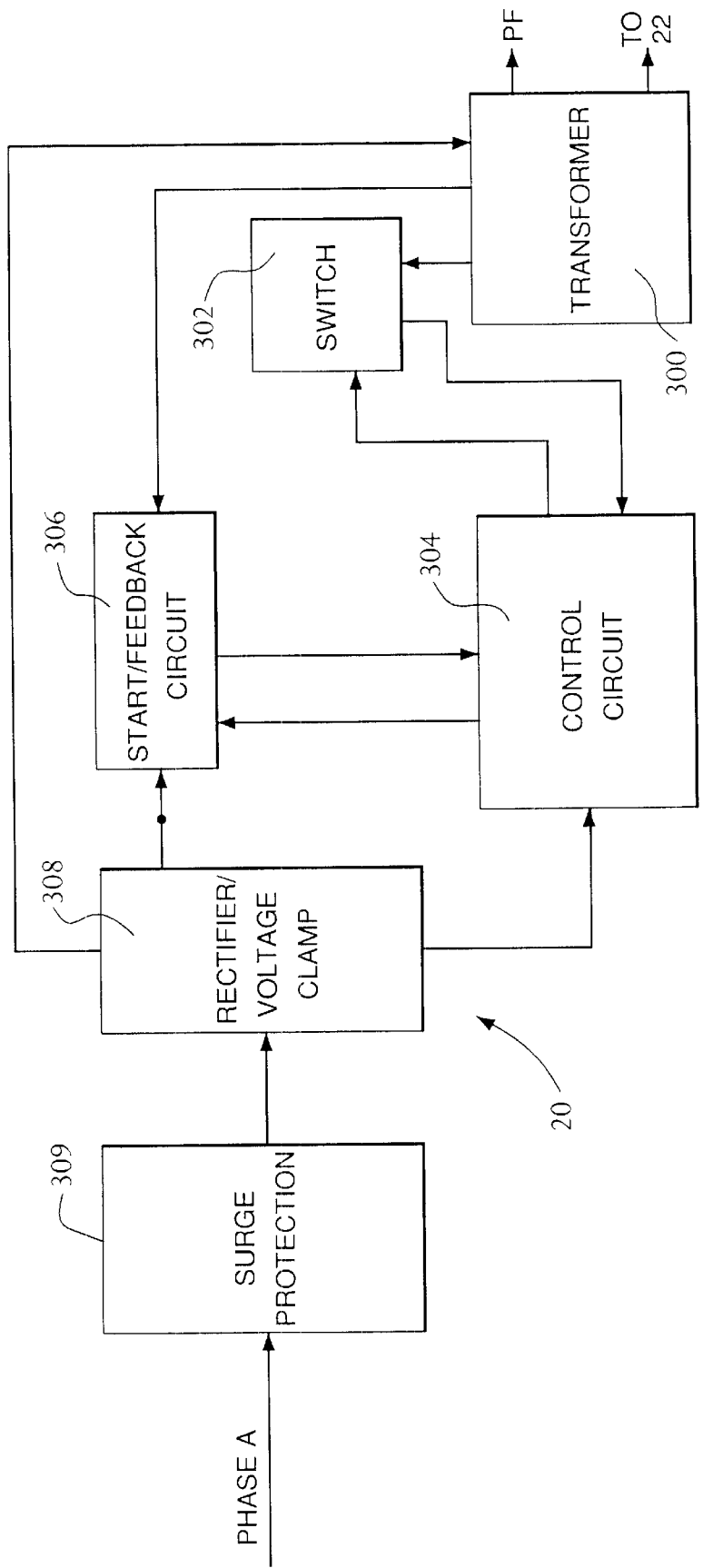
FIG. 9 is a block diagram of the power supply shown in FIG. 1.

Referring now to FIG. 9, power supply 20 for use in electronic meters includes a transformer 300 having primary and secondary windings. The input voltage (Phase A Voltage) is provided to the primary winding so that current may flow therethrough. As will be appreciated from FIG. 10, the secondary winding defines the output of the power supply. Referring back to FIG. 9, a switching member 302 is connected to the primary winding of transformer 300. Switching member 302 permits and prevents the flow of current through the primary winding. Switch member 302 is operable in response to a control signal, which control signal is generated by control circuit 304. Controller 304 generates the control signal in response to a limit signal generated by the start/feedback circuit 306 in response to the output of power supply 20. Voltage limiter 306 serves to limit the voltage applied to transformer 300 and switch 302. Surge protection circuit 309 is provided at the input to protect against surges appearing in the Phase A voltage.

Figure 10:
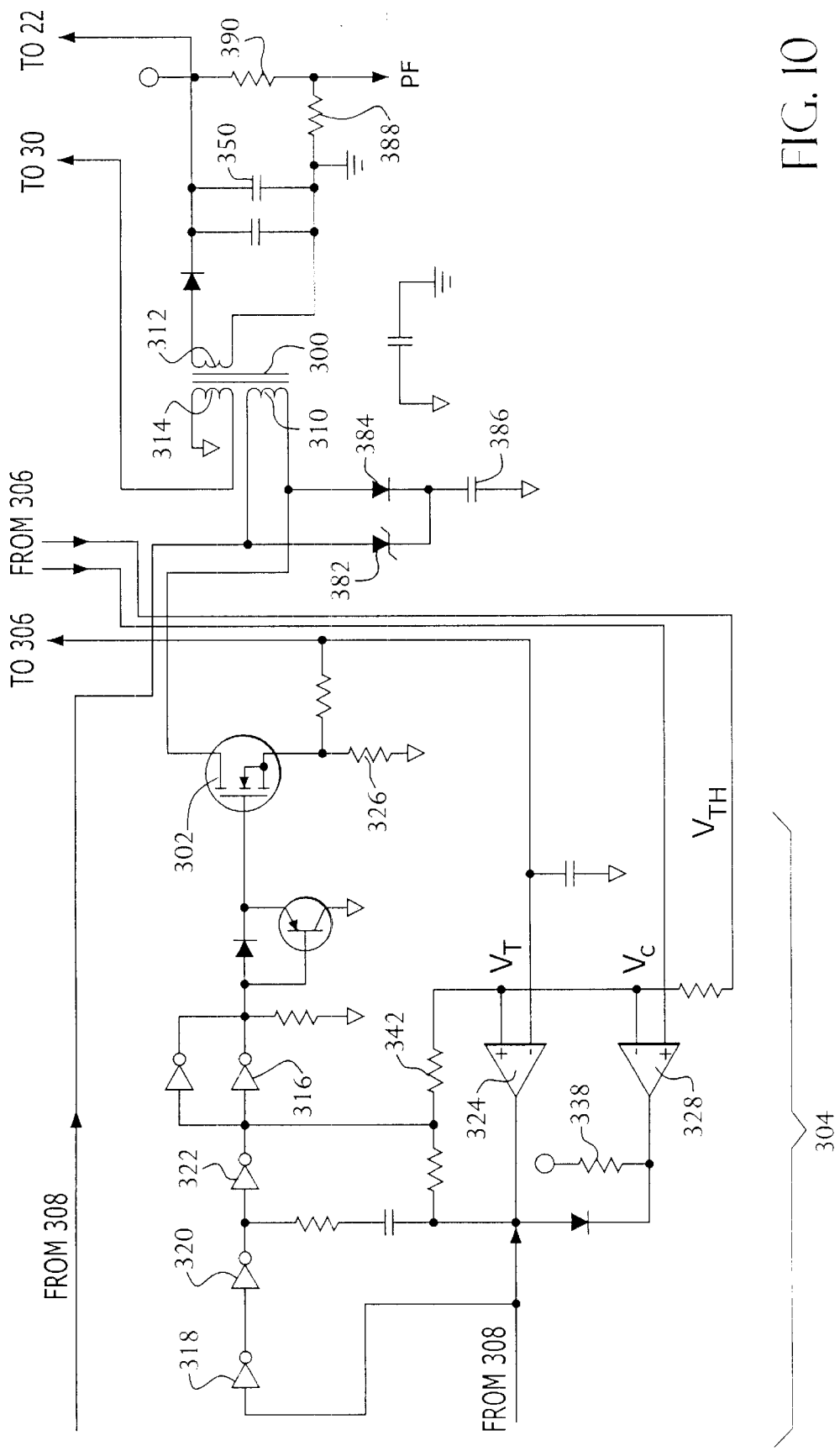
FIG. 10 is a schematic diagram of the control and switching members shown in FIG. 9.

Referring now to FIG. 10, transformer 300 and switch 302 are shown in greater detail. It will be appreciated that switch 302 is a transistor. At the beginning of each switching cycle, transistor 302 "turns on", i.e. becomes conductive, and magnetizes the core of transformer 300 by applying voltage across the primary 310. At the end of each cycle, transistor 302 turns off and allows the energy stored in the core of transformer 300 to flow to the output of the power supply, which "output" can be generally defined by secondary 312. Simultaneously, energy flows out of the bootstrap or tertiary winding 314 to power the control circuitry 304.

Feedback circuit 306 and controller 304 control the output of power supply 20 by varying the ON time of transistor 302. Controller 304 will be described in greater detail in relation to FIG. 10. Transistor 302 is connected through inverter 316 to receive the output of an oscillator formed from inverters 318, 320 and 322. It will be recognized that such inverters form a ring oscillator. The oscillator has a free-run frequency of 50 KHz. The ON time of transistor 302 may vary between 200 ns and 10 μs. The OFF time is always between 8 and 10 μs. During operation, the bootstrap winding 314 of transformer 300 (pins 10 and 11) powers controller 304, but this power is not available until the power supply has started. The control circuit is a current-mode regulator.

At the beginning of a switching cycle, transistor 302 is turned ON by the oscillator output. If left alone, transistor 302 would also be turned OFF by the oscillator output. Transistor 302 remains ON until the current in primary 310 of transformer 300 (pins 8 and 13) ramps up to the threshold current level $I_{th}$ represented as a voltage $V_{th}$. As will be explained below, $V_{th}$ is generated by feedback circuit 306. When the primary current of transformer 300, represented as a voltage $V_t$ and sensed by resistor 326, ramps up to the threshold level $V_{th}$, pin 1 of comparator 324 terminates the ON period of the oscillator by forcing the oscillator output HIGH, which output in turn is inverted by inverter 316, shutting OFF transistor 302. Transistor 302 then turns OFF until the next switching cycle. Since the $V_{th}$ indirectly controls the ON time of transistor 302, controller 304 regulates the output voltage of the power supply by comparing the sensed current in transformer 300 to this threshold level.

Transistor 362 and pin 7 of comparator 326 can disable the oscillator. Transistor 362, described in greater detail in FIG. 12, disables the oscillator when the line voltage exceeds 400 volts. Comparator 328 disables the oscillator when the controller 304 has insufficient voltage to properly drive transistor 302. The voltage in controller 304, $V_c$, will be described in relation to FIG. 10.

Figure 11:
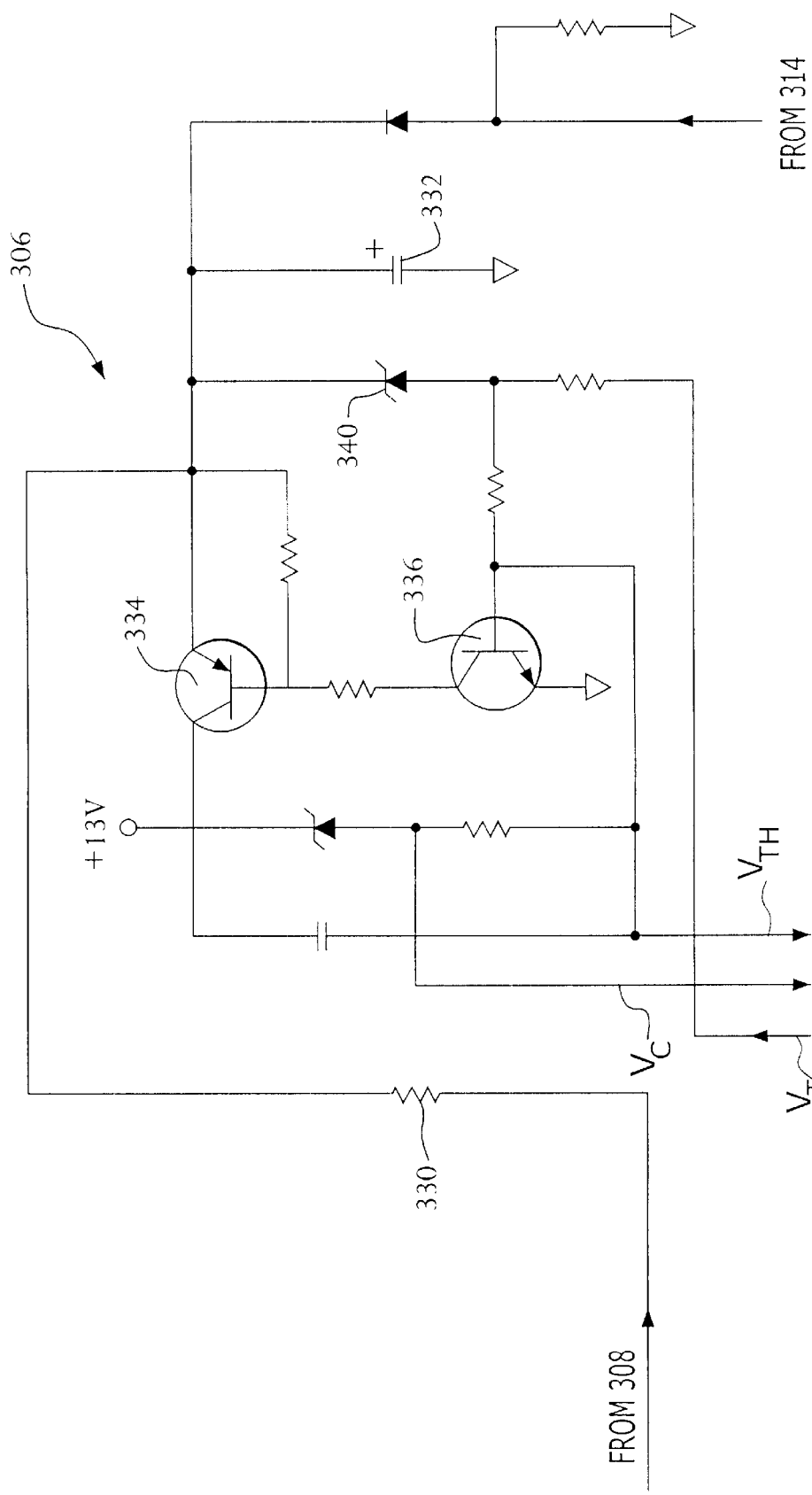
FIG. 11 is a schematic diagram of the startup/feedback shown in FIG. 9.

Consider now feedback circuit 306, shown in FIG. 11. When connected to the Phase A Voltage, resistor 330 slowly charges capacitor 332. The high value of resistor 330 and the 400 volt limit by voltage clamp 306 limit the power dissipation of resistor 330. After a few seconds, capacitor 332 charges above 13 volts. Transistors 334 and 336 then provide positive feedback to each other and snap ON. Controller 304 can run for tens of milliseconds from the charge stored in capacitor 332. Normally, power supply 20 will successfully start and begin to power itself in this period. If it fails to start, transistors 334 and 336 turn OFF when the charge across capacitor 332 drops below 8.5 volts and capacitor 332 again charges through resistor 330. This cycle repeats until the supply starts.

With high input voltages and without resistor 338 (FIG. 10), the current sourced by resistor 330 can hold the control and start-up circuits in a disabled state that does not recycle. When Capacitor 332 drops below 8.5 volts, resistor 338 places a load on the control circuit supply. This load insures that the start-up circuit recycles properly with high input voltages.

As indicated above, when the primary current of transformer 300 sensed by resistor 326 ramps up to the threshold level $V_{th}$, pin 1 of comparator 324 can terminate the ON period of the oscillator. When the voltage on capacitor 332 is less than 13 volts, zener diode 340 provides no voltage feedback. Under these conditions, the base-emitter voltage of transistor 336 sets the current threshold $I_{th}$ to about 650 mA. This maximum current limit protects transistor 302, as well as those transistors in voltage clamp 306, and prevents transformer 300 from saturating.

As the voltage on capacitor 332, which is representative of the output voltage of the supply, approaches the proper level, zener diode 340 begins to conduct and effectively reduces the current threshold, i.e. effectively reduces $V_{th}$. Each switching cycle will then transfers less power to the output, and the supply begins to regulate its output.

When the regulating circuitry requires ON times of transistor 302 less than about 400 ns, the current sense circuitry does not have time to react to the primary current of transformer 300. In that case, the regulating circuit operates as a voltage-mode pulse width modulator. Resistor 342 (FIG. 10) generates a negative step at pin 3 of comparator 324 at the beginning of each switching cycle. The regulator feedback voltage at pin 2 of comparator 324, which contains little current information at the beginning of each switching cycle, translates the step at pin 3 into various input overdrives of comparator 324, thereby driving the output of comparator 324 to a logic HIGH level. The propagation time of the comparator 324 decreases with increasing overdrive, i.e. as the negative step increases, and the circuit acts as a pulse width modulator. The negative step will increase due to the changing level of $V_{th}$.

Any leakage inductance between the bootstrap winding (pins 10 and 11 of transformer 300) and the output winding (pins 3 and 4 of transformer 300) causes inaccurate tracking between the voltage on capacitor 332 and the output voltage of the supply. This leakage inductance can cause poor load regulation of the supply. The bootstrap and output windings are bifilar wound; they are tightly coupled, have little leakage inductance, and provide acceptable load regulation. Since the two windings are in direct contact, the bootstrap winding requires Teflon insulation to meet the isolation voltage specifications. A 100% hi-pot test during manufacture insures the integrity of the insulation.

Figure 12:
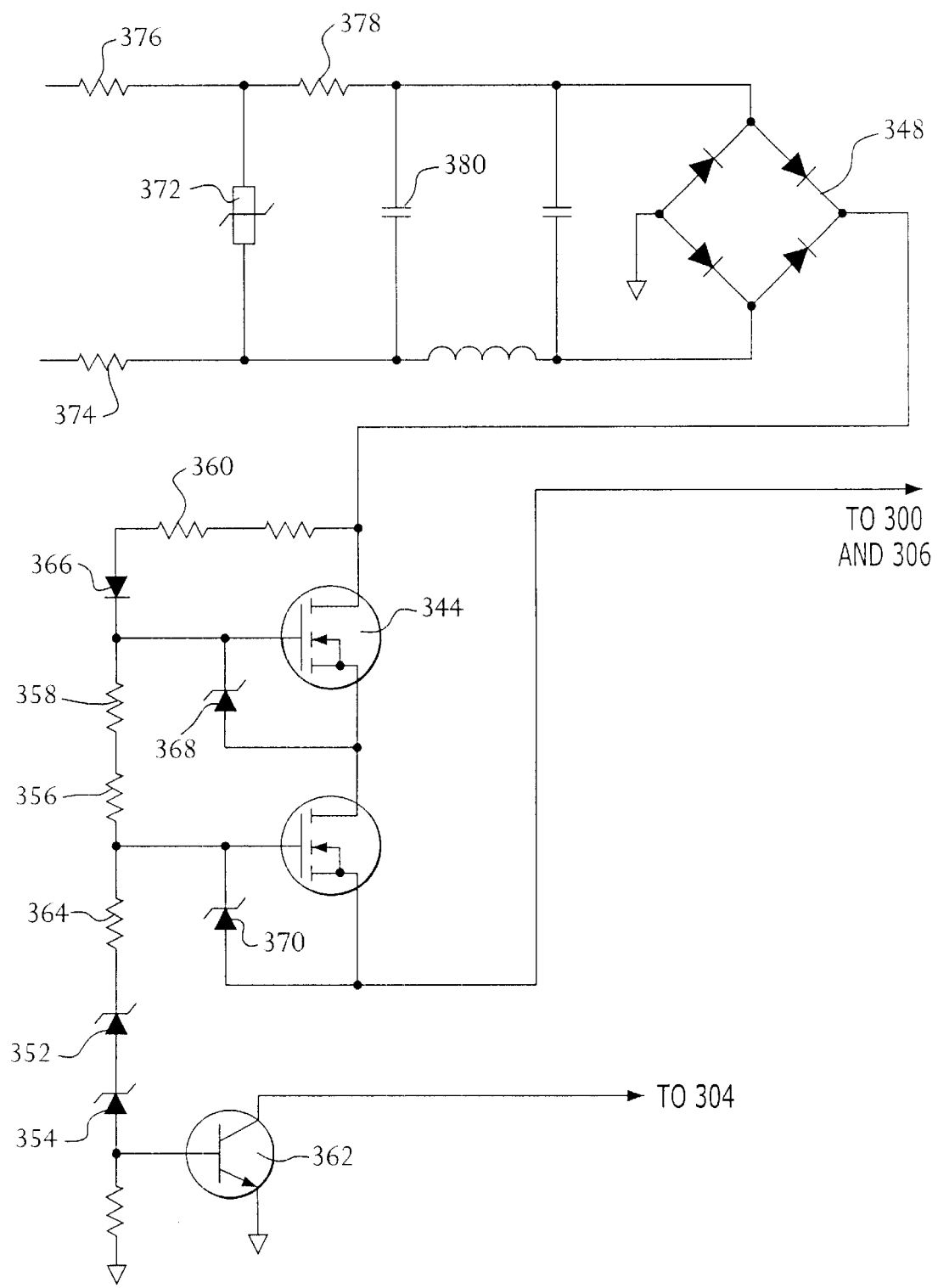
FIG. 12 is a schematic diagram of the voltage clamp shown in FIG. 9.

Consider now the details of voltage clamp 306, shown in FIG. 12. A 528 VAC input corresponds to 750 VDC after rectification. Switching transistors that can directly handle these voltages are extremely expensive. By using the voltage clamp of the present invention, relatively inexpensive switching transistors can be utilized.

In power supply 20, the switching member 302 is shut down during parts of the AC cycle that exceed 400 volts. The switching transistor, transistor 302, in conjunction with two other transistors 344 and 346, can hold off 750 VDC. During surge conditions, these three transistors can withstand over 1500 volts. In the preferred embodiment, transistors 302, 344 and 346 are 600-volt MOSFETs.

Because high-voltage electrolytic capacitors are expensive and large, this voltage clamp 306 has no bulk filter capacitor after the bridge rectifier 348. Without a bulk filter capacitor, this switching converter must shut down during parts of the AC cycle. It intentionally shuts down during parts of the AC cycle that exceed 400 volts, and no input power is available when the AC cycle crosses zero. The 2200 $\mu$F output capacitor 350 (FIG. 10), provides output current during these periods.

As discussed above, transistors 344 and 346 act as a voltage clamp and limit the voltage applied to switching member 302. At a 528 VAC line voltage, the input to the clamping circuit reaches 750 volts. During lightning-strike surges, this voltage may approach 1500 volts. When the voltage at the output of bridge rectifier 348 exceeds 400 volts, zener diodes 352 and 354 begin to conduct. These diodes, along with the 33 K$\Omega$ resistors 356, 358 and 360, create bias voltages for transistors 344 and 346. Transistors 344 and 346 act as source followers and maintain their source voltages a few volts below their gate voltages.

If, for example, the output of bridge rectifier 348 is at 1000 volts, the gates of transistors 344 and 346 will be at approximately 400 and 700 volts respectively. The source of transistor 344 applies roughly 700 volts to the drain of 346; the source of 346 feeds about 400 volts to switching member 302. Transistors 344 and 346 each drop 300 volts under these conditions and thereby share the drop from the 1000 volt input to the 400 volt output, a level which the switching converter 302 can withstand.

As zener diodes 352 and 354 begin to conduct and as transistors 344 and 346 begin to clamp, transistor 362 turns ON and shuts down the switching converter. Although transistors 344 and 346 limit the voltage fed to the converter to an acceptable level, they would dissipate an excessive amount of heat if the switching converter 302 consumed power during the clamping period.

When switching converter 302 shuts down, transistor 302 no longer has to withstand the flyback voltage from transformer 300. Resistor 364 takes advantage of this by allowing the output voltage of the clamp to approach 500 volts (instead of 400 volts) as the input to the clamp approaches 1500 volts. This removes some of the burden from transistors 344 and 346.

Zener diodes 352 and 354 are off and the converter 302 runs when the output of bridge rectifier 348 is below 400 volts. During these parts of the AC cycle, the 33 K$\Omega$ resistors 356, 358 and 360 directly bias the gates of transistors 344 and 346. The voltage drop across transistors 344 and 346 is then slightly more than the threshold voltages of those transistors along with any voltage drop generated by the channel resistance of those transistors.

During the off time of transistor 302, about 10 $\mu$S, the 33 K$\Omega$ resistors can no longer bias the gates of transistors 344 and 346. Diode 366 prevents the gate capacitance of transistors 344 and 346 and the junction capacitance of zeners 368 and 370 from discharging when transistor 302 is off. This keeps transistors 344 and 346 ON and ready to conduct when transistor 302 turns ON at the next switching cycle. If the gates of transistors 344 and 346 had discharged between switching cycles, they would create large voltage drops and power losses during the time required to recharge their gates through the 33 K$\Omega$ resistors.

In the preferred embodiment, two 33 K$\Omega$ resistors are used in series to obtain the necessary voltage capability from 966 surface-mount packages.

This power supply must withstand an 8 KV, 1.2×50 µS short-branch test. Varistor 372, resistors 374, 376 and 378, and capacitor 380 protect the power supply from lightning strike surges.

A 550 VAC varistor 372 serves as the basis of the protection circuit. It has the lowest standard voltage that can handle a 528 VAC input. The device has a maximum clamping voltage of 1500 volts at 50 amps.

A varistor placed directly across an AC line is subject to extremely high surge currents and may not protect the circuit effectively. High surge currents can degrade the varistor and ultimately lead to catastrophic failure of the device. Input resistors 374 and 376 limit the surge currents to 35 amps. This insures that the clamping voltage remains below 1500 volts and extends the life of the varistor to tens of thousands of strikes.

Resistor 378 and capacitor 380 act as an RC filter. The filter limits the rate of voltage rise at the output of the bridge rectifier. The voltage clamping circuit, transistors 344 and 346, is able to track this reduced dv/dt. Current forced through diodes 382, 384 and capacitor 386 (FIG. 10) is also controlled by the limited rate of voltage rise.

Resistors 374 and 376 are 1 watt carbon composition resistors. These resistors can withstand the surge energies and voltages. Resistor 378 is a flame-proof resistor that acts as a fuse in the event of a failure in the remainder of the circuit.

The values of resistors 374, 376 and 378 are low enough so that they do not interfere with the operation of the power supply or dissipate excessive amounts of power.

Finally it is noted that resistors 388 and 390 act to generate the power fail voltage PF.

By using the wide voltage ranging of the invention, a single meter can be used in both a four wire wye application as well as in a four wire delta application. It will be recognized that a four wire delta application includes 96V sources as well as a 208V source. In the past such an application required a unique meter in order to accommodate the 208V source. Now all sources can be metered using the same meter used in a four wire wye application.

Consider now the main operation of processor 16 in relation to FIGS. 2A–2E and FIG. 3. At step 1000 a reset signal is provided to microcontroller 16. A reset cycle occurs whenever the voltage level $V_{dd}$ rises through approximately 2.8 volts. Such a condition occurs when the meter is powered up.

At step 1002, microcontroller 16 performs an initialize operation, wherein the stack pointer is initialized, the internal ram is initialized, the type of liquid crystal display is entered into the display driver portion of microcontroller 16 and timers which requires initialization at power up are initialized. It will be noted that the operation of step 1002 does not need to be performed for each power failure occurrence. Following a power failure, microcontroller 16 at step 1004 returns to the main program at the point indicated when the power returns.

Upon initial power up or the return of power after a power failure, microcontroller 16 performs a restore function. At step 1006, microcontroller 16 disables pulses transmitted by processor 14. These pulses are disabled by providing the appropriate signal restore bit. The presence of this bit indicates that a restore operation is occurring and that pulses generated during that time should be ignored. Having set the signal restore bit, microcontroller 16 determines at step 1008 whether the power fail signal is present. If the power fail signal is present, microcontroller 16 jumps to the power fail routine at 1010. In the power fail routine, the output ports of microcontroller 16 are written low unless the restore bit has not been set. If the restore bit has not been set, data in the microcontroller 16 is written to memory.

If the power fail signal is not present, microcontroller 16 displays segments at step 1012. At this time, the segments of the display are illuminated using the phase A potential. It will be recalled that phase A potential is provided to microcontroller 16 from processor 14. At 1014, the UART port and other ports are initialized at 1016, the power fail interrupts are enabled such that if a falling edge is sensed from output A of processor 14, an interrupt will occur indicating power failure. It will be recalled that processor 14 compares the reference voltage VREF to a divided voltage generated by the power supply 20. Whenever the power supply voltage falls below the reference voltage a power fail condition is occurring.

At step 1018, the downloading of the metering integrated circuit is performed. It will be appreciated that certain tasks performed by microcontroller 16 are time dependent. Such tasks will require a timer interrupt when the time for performing such tasks has arrived.

At 1022, the self-test subroutines are performed. Although no particular self-tests subroutine is necessary in order to practice the present invention, such subroutines can include a check to determine if proper display data is present. It is noted that data is stored in relation to class designation and that a value is assigned to each class such that the sum of the class values equals a specified number. If any display data is missing, the condition of the class values for data which is present will not equal the specified sum and an error message will be displayed. Similarly, microcontroller 16 compares the clock signal generated by processor 14 with the clock signal generated by watch crystal 32 in order to determine whether the appropriate relationship exists.

Having completed the self-test subroutines, the ram is re-initialized at 1024. In this re-initialization, certain load constants are cleared from memory. At 1026, various items are scheduled. For example, the display update is scheduled so that as soon as the restore routine is completed, data is retrieved and the display is updated. Similarly, optical communications are scheduled wherein microcontroller 16 determines whether any device is present at optical port desired to communicate. Finally, at 1028 a signal is given indicating that the restore routine has been completed. Such a signal can include disabling the signal restore bit. Upon such an occurrence, pulses previously disabled will now be considered valid. Microcontroller 16 now moves into the main routine.

At 1030, microcontroller 16 calls the time of day processing routine. In this routine, microcontroller 16 looks at the one second bit of its internal and determines whether the clock needs to be changed. For example, at the beginning and end of Daylight Savings Time, the clock is moved forward and back one hour, respectively. In addition, the time of day processing routine sets the minute change flags and date change flags. As will be appreciated hereinafter, such flags are periodically checked and processes occur if such flags are present.

It will be noted that there are two real time interrupts scheduled in microcontroller 16 which are not shown in FIG. 2, namely the roll minute interrupt and the day interrupt. At the beginning of every minute, certain minute tasks occur. Similarly, at the beginning of every day, certain day tasks occur. Since such tasks are not necessary to the practice of the presently claimed invention, no further details need be provided.

At 1032, microcontroller 16 determines whether a self-reprogram routine is scheduled. If the self-reprogram routine is scheduled, such routine is called at 1034. The self-reprogram typically programs in new utility rates which are stored in advance. Since new rates have been incorporated, it will be necessary to also restart the display. After operation of the self-reprogram routine, microcontroller 16 returns to the main program. If it is determined at 1032 that the self-reprogram routine is not scheduled, microcontroller 16 determines at 1036 whether any day boundary tasks are scheduled. Such a determination is made by determining the time and day and searching to see whether any day tasks are scheduled for that day. If day tasks are scheduled, such tasks are called at 1038. If no day tasks are scheduled, microcontroller 16 next determines at 1040 whether any minute boundary tasks have been scheduled. It will be understood that since time of use switch points occur at minute boundaries, for example, switching from one use period to another, it will be necessary to change data storage locations at such a point. If minute tasks are scheduled, such tasks are called at 1042. If minute boundary tasks have not been scheduled, microcontroller 16 determines at 1044 whether any self-test have been scheduled. The self-tests are typically scheduled to occur on the day boundary. As indicated previously, such self-tests can include checking the accumulative display data class value to determine whether the sum is equal to a prescribed value. If self-tests are scheduled, such tests are called at 1046. If no self-tests are scheduled, microcontroller 16 determines at 1048 whether any season change billing data copy is scheduled. It will be appreciated that as season changes billing data changes. Consequently, it will be necessary for microcontroller 16 to store energy metered for one season and begin accumulating energy metered for the following season. If season change billing data copy is scheduled, such routine is called at 1050. If no season change routine is scheduled, microcontroller 16 determines at 1052 whether the self-redemand reset has been scheduled. If the self-redemand reset is scheduled, such routine is called at 1054. This routine requires microcontroller 16 to in effect read itself and store the read value in memory. The self-redemand is then reset. If self-redemand reset has not been scheduled, microcontroller 16 determines at 1056 whether a season change demand reset has been scheduled. If a season change demand reset is scheduled, such a routine is called at 1058. In such a routine, microcontroller 16 reads itself and resets the demand.

Figure 6:
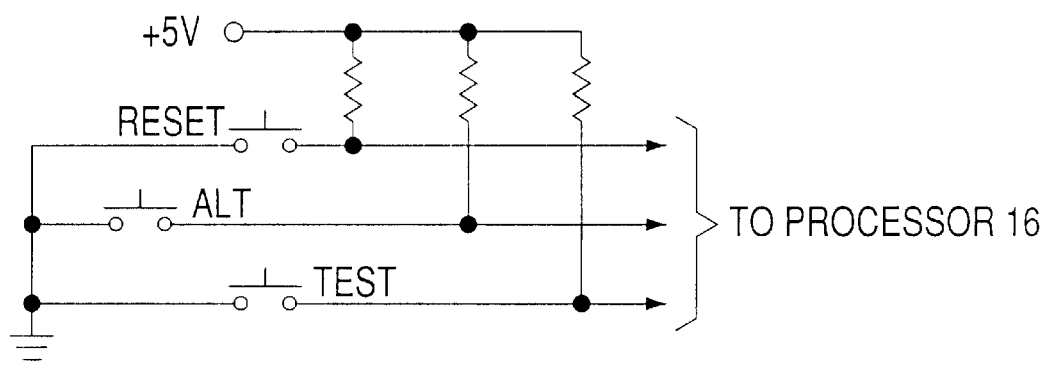
FIG. 6 is a schematic diagram of certain command buttons contained in the meter.

At 1060, microcontroller 16 determines whether button sampling has been scheduled. Button sampling will occur every eight milliseconds. Reference is made to FIG. 6 for a more detailed description of an arrangement of buttons to be positioned on the face of meter 10. Consequently, if an eight millisecond period has passed, microcontroller 16 will determine that button sampling is scheduled and the button sampling routine will be called at 1062. If button sampling is not scheduled, microcontroller 16 determines at 1064 whether a display update has been scheduled. This routine causes a new quantity to be displayed on LCD 30. As determined by the soft switch settings, display updates are scheduled generally for every three-six seconds. If the display is updated more frequently, it may not be possible to read the display accurately. If the display update has been scheduled, the display update routine is called at 1066. If a display update has not been scheduled, microcontroller 16 determines at 1068 whether an annunciator flash is scheduled. It will be recalled that certain annunciators on the display are made to flash. Such flashing typically occurs every half second. If an annunciator flash is scheduled, such a routine is called at 1070. It is noted in the preferred embodiment that a directional annunciator will flash at the same rate at which energy determination pulses are transmitted from processor 14 to processor 16. Another novel feature of the invention is that other annunciators (not indicative of energy direction) will flash at a rate approximately equal to the rate of disk rotation in an electromechanical meter used in a similar application.

If no annunciator flash is scheduled, microcontroller 16 determines at 1072 whether optical communication has been scheduled. It will be recalled that every half second microcontroller 16 determines whether any signal has been generated at optical port. If a signal has been generated indicating that optical communications is desired, the optical communication routine will be scheduled. If the optical communication routine is scheduled, such routine is called at 1074. This routine causes microcontroller 16 to sample optical port 40 for communications activity. If no optical routine is scheduled, microcontroller 16 determines at 1076 whether processor 14 is signaling an error. If processor 14 is signaling an error, microcontroller 16 at 1078 disables the pulse detection, calls the download routine and after performance of that routine, re-enables the pulse detection. If processor 14 is not signaling any error, microcontroller 16 determines at 1080 whether the download program is scheduled. If the download program is scheduled, the main routine returns to 1078 and thereafter back to the main program.

If the download program has not been scheduled or after the pulse detect has been re-enabled, microcontroller 16 determines at 1082 whether a warmstart is in progress. If a warmstart is in progress, the power fail interrupts are disabled at 1084. The pulse computation routine is called after which the power fail interrupts are re-enabled. It will be noted that in the warmstart data is zeroed out in order to provide a fresh start for the meter. Consequently, the pulse computation routine performs the necessary calculations for energy previously metered in places that computation in the appropriate point in memory. If a warmstart is not in progress, microcontroller 16 at 1086 updates the remote relays. Typically, the remote relays are contained on a board other than the electronics assembly board.

All data that is considered non-volatile for meter 10, is stored in a 2 kbytes EEPROM 35. This includes configuration data (including the data for memory 76 and memory 80), total kWh, maximum and cumulative demands (Rate A demands in TOU), historic TOU data, cumulative number of demand resets, cumulative number of power outages and the cumulative number of data altering communications. The present billing period TOU data is stored in the RAM contained within processor 16. As long as the microcontroller 16 has adequate power, the RAM contents and real time are maintained and the microcontroller 16 will not be reset (even in a demand register).

LCD 30 allows viewing of the billing and other metering data and statuses. Temperature compensation for LCD 30 is provided in the electronics. Even with this compensation, the meter's operating temperature range and the LCD's 5 volt fluid limits LCD 30 to being triplexed. Hence, the maximum number of segments supported in this design is 96. The display response time will also slow noticeably at temperatures below −30 degrees celsius. For a more complete description of the generation of a display signal for display U.S. Pat. No. 5,555,508, 30 reference is made to which is and incorporated herein by reference.

Figure 3:
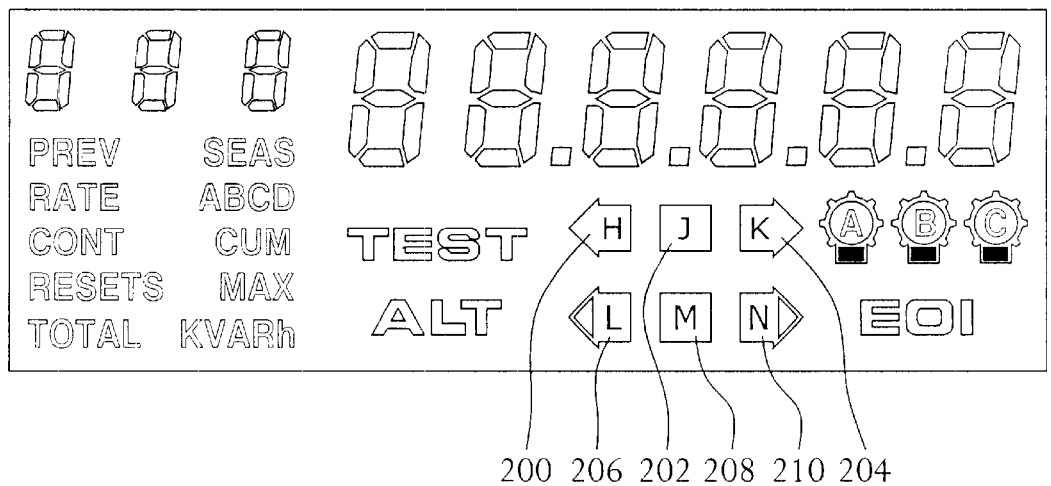
FIG. 3 is a front elevation of the liquid crystal display shown in FIG. 1.

The 96 available LCD segments, shown in FIG. 3, are used as follows. Six digits (0.375 high) are used for data display and three smaller digits (0.25 high) for numeric identifiers. In addition to the numeric identifiers, there are seventeen alpha annunciators that are used for identification.

These are: PREV, SEAS, RATE, A, B, C, D, CONT, CUM, RESETS, MAX, TOTAL, KV /, \, -\, R, and h. The last five annunciators can be combined to produce: KW, KWh, KVA, KVAh, KVAR, or KVARh, as shown. Three potential indicators are provided on the LCD and appear as light bulbs. These indicators operate individually and are on continuously when the corresponding phase's potential is greater than 57.6 Vrms, and flash when the potential falls below 38.4 Vrms. "TEST" "ALT", and "EOI" annunciators are provided to give an indication of when the unit is in test mode, alternate scroll mode, or an end of a demand interval has occurred. Six (6) pulse indicators 200–210 are also provided on LCD 30 for watt-hours and an alternate quantity (VA-hours or VAR-hours).

Pulse indicators 200–210 are configured as two sets of three, one set for indicating watts and another set for indicating VARhours. Each set has a left arrow, a solid square, and a right arrow. During any test, one of the arrows will be made to blink at the rate microcontoller 16 receives pulses from processor 14 while the square will blink at a lower rate representative of a disk rotation rate and in a fashion which mimics disk rotation. It will be noted that signals necessary to flash indicators 200–210 are generated by processor 16 in energy pulse interrupt routines. The left arrow 200 blinks when energy is received from the metered site and the right arrow 204 blinks when energy is delivered to the metered site. The solid square 202 blinks at a Kh rate equivalent to an electromechanical meter of the same form, test amperes, and test voltage. Square 202 blinks regardless of the direction of energy flow. The rate at which square 202 blinks can be generated by dividing the rate at which pulses are provided to processor 16. Consequently, testing can occur at traditional rates (indicative of disk rotation) or can occur at faster rates, thereby reducing test time. Indicators 206–210 operate in a similar fashion, except in relation to apparent reactive energy flow.

These pulse indicators can be detected through the meter cover using the reflective assemblies (such as the Skan-A-Matic C42100) of existing test equipment. As indicated above, the second set of three indicators indicate apparent reactive energy flow and have the tips of arrows 206 and 210 open so that they will not be confused with the watt-hour indicators.

Figure 4:
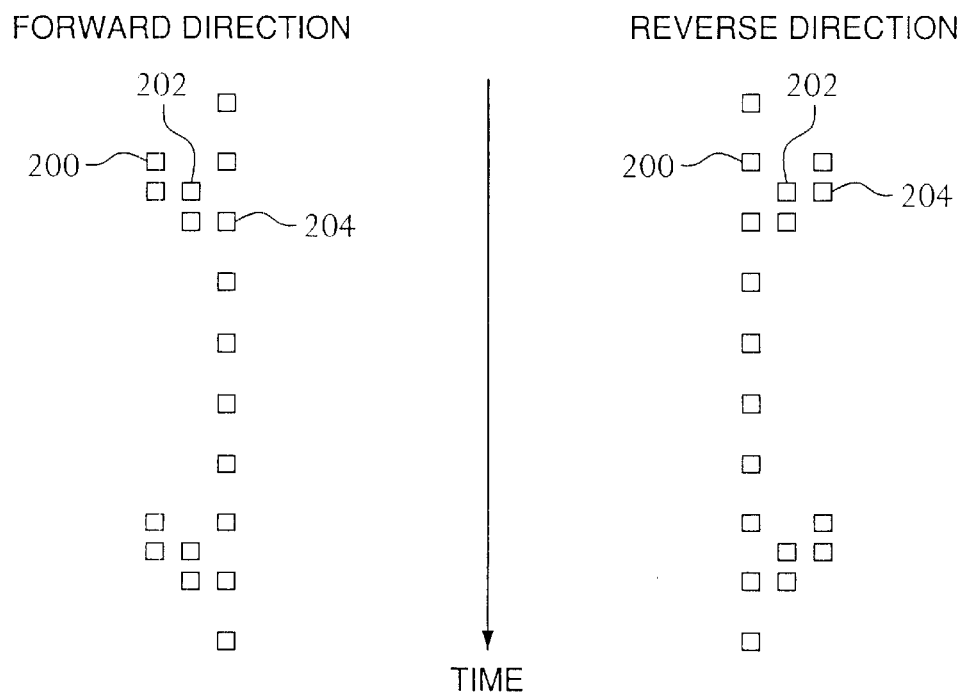
FIG. 4 is a diagrammatic view of select annunciators of the liquid crystal display shown in FIG. 3.

Referring to FIG. 4, it will be seen that annunciators 200–204 are positioned along a line, wherein annunciator 202 is positioned between annunciators 200 and 204. As time progresses, processor 16 generates display signals so that, when energy is flowing in the forward direction, annunciator 204 always flashes. However, annunciators 200 and 202 can be made to flash selectively, to create the impression that energy is flowing from left to right. When energy is flowing in the reverse direction, the reverse is true. Annunciator 200 flashes continuously, and annunciators 202 and 204 flash selectively to mimic energy flowing from right to left.

Meter 10 interfaces to the outside world via liquid crystal display 30, optical port 40, or option connector 38. It is envisioned that most utility customers will interface to LCD 30 for testing of the meter, some utilities will desire an infrared LED, such as LED 112, to test the meter calibration. Traditionally, electronic meters have provided a single light emitting diode (LED) in addition to an optical port to output a watthour pulse. Such designs add cost, decrease reliability and limit test capabilities. The present invention overcomes these limitations by multiplexing the various metering function output signals and pulse rates over optical port 40 alone. Meter 10 echoes the kh value watthour test output on optical port 40 anytime the meter has been manually placed in the test mode (the TEST command button in FIG. 5 has been pressed) or alternate scroll mode (the ALT command button in FIG. 5 has been pressed). While in these manually initiated modes, communication into processor 16 through optical port 40 is prevented. It is noted that in the preferred embodiment, the ALT button is capable of being enabled without removal of the meter cover (not shown). To this end a small movable shaft (not shown) is provided in the meter cover so that when the shaft is moved the ALT component is enabled. Consequently, removal of the meter cover is not necessary in order to test the meter.

Figure 5:
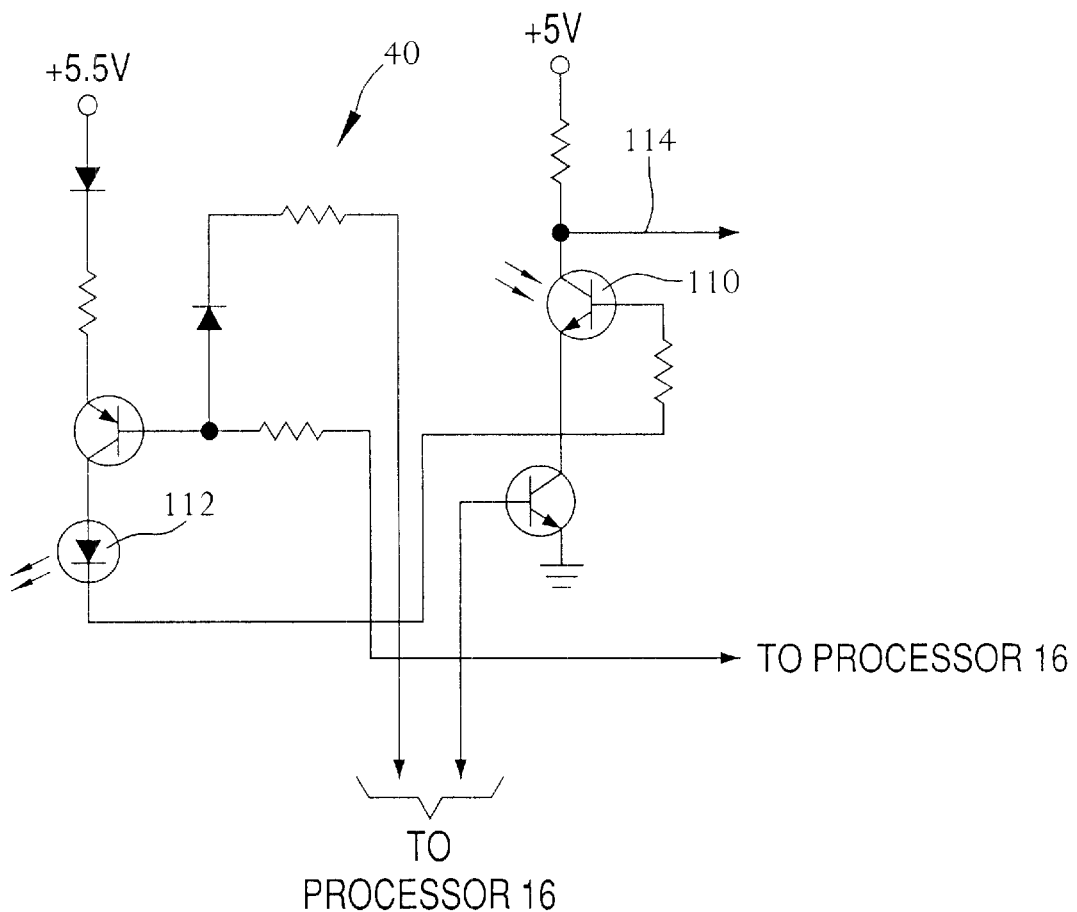
FIG. 5 is a schematic diagram of the optical port shown in FIG. 1.

Referring now to FIG. 5, optical port 40 and reset circuitry 108 are shown in greater detail. Optical port 40 provides electronic access to metering information. The transmitter and receiver (transistors 110 and 112) are 850 nanometer infrared components and are contained in the electronics assembly (as opposed to being mounted in the cover). Transistors 110 and led 112 are tied to UART include within microcontroller 16 and the communications rate (9600 baud) is limited by the response time of the optical components. The optical port can also be disabled from the UART (as described below), allowing the UART to be used for other future communications without concern about ambient light. During test mode, optical port 40 will echo the watthour pulses received by the microcontroller over the transmitting LED 112 to conform to traditional testing practices without the necessity of an additional LED.

Meter 10 also provides the ability to be placed in the test mode and exit from the test mode via an optical port function, preferably with a data command. When in a test mode initiated via optical port 40, the meter will echo metering pulses as defined by the command transmitted on the optical port transmitter. This allows the multiplexing of metering functions or pulse rates over a single LED. In the preferred embodiment, such a multiplexing scheme is a time based multiplexing operation. The meter will listen for further communications commands. Additional commands can change the rate or measured quantity of the test output over optical port 40. The meter will "ACK" any command sent while it is in the test mode and it will "ACK" the exit test mode command. While in an optically initiated test mode, commands other than those mentioned above are processed normally. Because there is the possibility of an echoed pulse confusing the programmer-readers receiver, a command to stop the pulse echo may be desired so communications can proceed uninterrupted. If left in test mode, the usual test mode time out of three demand intervals applies.

The data command identified above is called "Enter Test Mode" and is followed by 1 data byte defined below. The command is acknowledged by processor 16 the same as other communications commands. The command places meter 10 into the standard test mode. While in this mode, communications intercommand timeouts do not apply. Hence, the communications session does not end unless a terminate session command is transmitted or test mode is terminated by any of the normal ways of exiting test mode (pressing the test button, power failure, etc.), including the no activity timeout. Display 30 cycles through the normal test mode display sequence (see the main program at 1044, 1060 and 1064) and button presses perform their normal test mode functions. Transmitting this command multiple times causes the test mode, and its associated timeout counter, to restart after each transmission.

The data byte defines what input pulse line(s) to processor 16 should be multiplexed and echoed over optical port 40.

Multiple lines can be set to perform a totalizing function. The definition of each bit in the data byte is as follows:

bit0=alternate test pulses,
bit1=alternate delivered pulses,
bit2=alternate received pulses,
bit3=whr test pulses,
bit4=whr delivered pulses,
bit5=whr received pulses,
bits 6 and 7 are unused.

If no bits are set, the meter stops echoing pulses. This can be used to allow other communications commands to be sent without fear of data collision with the output pulses. While in this mode, other communications commands can be accepted. The test data can be read, the meter can be reprogrammed, the billing data can be reset or a warmstart can be initiated. Since the Total KWH and Maximum Demand information is stored to EEPROM 35, test data is being processed in memory areas and functions such as demand reset and warmstart will operate on the Test Mode data and not the actual billing data. Any subsequent "Enter Test Mode Command" resets the test mode data just as a manual demand reset would in the test mode.

This command also provides the utility with a way to enter the test mode without having to remove the meter cover. This will be beneficial to some utilities.

While the invention has been described and illustrated with reference to specific embodiments, those skilled in the art will recognize that modification and variations may be made without departing from the principles of the invention as described herein above and set forth in the following claims.

What is claimed is:

1. An apparatus for metering a plurality of types of electrical power and electronically communicating electrical power information, said electrical power comprising voltage and current characteristics determined in accordance with sensed analog voltage and current signals, said apparatus comprising:
   a first processor which receives said analog voltage and current signals and converts said analog voltage and current signals to digital voltage and current signals, said first processor determining at least one selected type of metered power based on said digital voltage and current signals and outputting a metering signal representative of said at least one selected type of metered power;
   a second processor which receives said metering signal and outputs at least one output signal based on said metering signal; and
   a commuincations interface, which receives said at least one output signal and communicates said electrical power information external to said apparatus in a format specific to said communications interface,
   wherein said second processor adapted to be configured via said communications interface.

2. The apparatus as recited in claim 1, further comprising a display having a plurality of visible annunciators, and wherein said at least one output signal comprises a display signal.

3. The apparatus as recited in claim 2, wherein said second processor outputs said display signal to selectively activate said visible annunciators.

4. The apparatus as recited in claim 2, wherein said metering signal is further representative of a direction and rate of power flow and said display signal is further representative of said direction, and wherein said display signal selectively activates said visible annunciators to indicate said rate and direction of power flow.

5. The apparatus as recited claim 4, wherein said visible annunciators are selectively activated such that rotation of a disk is mimicked.

6. The apparatus as recited in claim 5, wherein said visible annunciators are positioned on said display so that the rate of the power flow, the rate of disk rotation and the direction of power flow can be concurrently displayed.

7. The apparatus as recited in claim 4, wherein at least one of said plurality of visible annunciators is activated at said rate of power flow based on a unit of power of said at least one type of metered power.

8. The apparatus as recited in claim 7, wherein said at least one of said plurality of visible annunciators is made visible based on the $K_h$ value of said apparatus.

9. The apparatus as recited in claim 4, wherein said display alternately displays a plurality of metered powered types in accordance with said display signal output by said second processor.

10. The apparatus as recited in claim 2, wherein all visible annunciators are displayed in response to said display signal.

11. The apparatus as recited in claim 2, wherein said display comprises a liquid crystal display.

12. The apparatus as recited in claim 1, wherein said communications interface comprises an optical port and said at least one output signal comprises an asynchronous communication signal, and where n said optical port transmits information by converting said asynchronous communication signal to a predetermined wavelength of light.

13. The apparatus as recited in claim 12, wherein said optical port is adapted to receive and convert said predetermined wavelength of light to said asynchronous communication signal, and wherein said second processor is capable of receiving commands input to said optical port via said serial asynchronous communication signal.

14. The apparatus as recited in claim 13, wherein said second processor selects said at least one type of metered power from a plurality of types of metered power such that different metered power types can be transmitted from said optical port at different times.

15. The apparatus as recited in claim 14, wherein said second processor selects said at least one type of metered power in response to a control signal received by said optical port.

16. The apparatus as recited in claim 12, wherein said metering signal is further representative of a direction and rate of power flow and said asynchronous communication signal is further representative of said rate of power flow.

17. The apparatus as recited in claim 16, wherein said information transmitted by said optical port is representative of said rate of power flow.

18. The apparatus as recited in claim 12, wherein the second processor selects a plurality of types of metered power and multiplexes said plurality of metered power types over said optical port such that said plurality of types of metered power are transmitted by said optical power.

19. The apparatus as recited in claim 12, wherein said second processor acknowledges an input from said optical port by echoing said input, and wherein said input places second processor into a condition to receive additional data from said optical port.

20. The apparatus as recited in claim 12, wherein said second processor is programmable using said optical port.

21. The apparatus as recited in claim 1, wherein said output device comprises an option connector and said at least one output signal comprises a serial communications signal.

22. The apparatus as recited in claim 21, wherein said option connector is adapted to receive said serial communication signal, and wherein said second processor is capable receiving commands input to said option connector.

23. The apparatus as recited in claim 1, wherein said at least one type of metered power comprises real power, reactive power, and apparent power.

24. The apparatus as recited in claim 1, wherein said first processor receives plural phases of analog voltage and current signals, at least two of said plural phases being input to respective analog to digital converters to be converted into said digital voltage and current signals.

25. An apparatus for metering a plurality of types of electrical power and electronically communicating electrical power information, said electrical power comprising voltage and current characteristics determined in accordance with sensed analog voltage and current signals, said apparatus comprising:

a first processor which receives said analog voltage and current signals and converts said analog voltage and current signals to digital voltage and current signals, said first processor determining at least one selected type of metered power based on said digital voltage and current signals and outputting a metering signal representative of said at least one selected type of metered power;

a second processor which receives said metering signal and outputs at least one output signal based on said metering signal;

a non-volatile memory, connected to said second processor, which stores configuration information; and a communications interface, which receives said at least one output signal and communicates said electrical power information external to said apparatus in a format specific to said communications interface, wherein said first processor and said second processor determine said at least one type of metered power in accordance with said configuration information stored in said non-volatile memory; and wherein said non-volatile memory and said second processor are configurable via said communications interface.

26. The apparatus as recited in claim 25, further comprising a display having a plurality of visible annunciators, wherein said at least one output signal comprises a display signal, and wherein said second processor outputs said display signal to selectively activate said visible annunciators.

27. The apparatus as recited in claim 26, wherein said metering signal is further representative of a direction and rate of power flow and said display signal is further representative of said direction, and wherein said display signal selectively activates said visible annunciators to indicate said direction of power flow.

28. The apparatus as recited in claim 27, wherein one of said visible annunciators is made visible at the rate determined in accordance with a unit of power of said at least one type of metered power, wherein the rate is a predetermined fraction of said unit of power and is set in accordance with said configuration information.

29. The apparatus as recited in claim 28, wherein said one of said visible annunciators is made visible based on the $K_h$ value of said apparatus.

30. The apparatus as recited in claim 25, wherein said output device comprises an optical port and said at least one output signal comprises an asynchronous communication signal, wherein said optical port transmits information by converting said asynchronous communication signal to a predetermined wavelength of light, and wherein said optical port receives and converts said predetermined wavelength of light to said asynchronous communication signal to communicate with said second processor.

31. The apparatus as recited in claim 30, wherein said metering signal is further representative of a direction and rate of power flow and said asynchronous communication signal is further representative of said rate of power flow, and wherein said information transmitted by said optical port is representative of said rate of power flow.

32. The apparatus as recited in claim 31, wherein the second processor selects a plurality of types of metered power and multiplexes said plurality of metered power types over said optical port such that said plurality of types of metered power are transmitted by said optical power.

33. The apparatus as recited in claim 25, wherein said at least one type of metered power comprises real power, reactive power, and apparent power.

34. The apparatus as recited in claim 25, wherein said first processor receives plural phases of analog voltage and current signals, at least two of said plural phases being input to respective analog to digital converters to be converted into said digital voltage and current signals.

* * * * *

UNITED STATES PATENT AND TRADEMARK OFFICE
CERTIFICATE OF CORRECTION

PATENT NO.   : 6,504,357 B1
DATED        : January 7, 2003
INVENTOR(S)  : Rodney C. Hemminger and Mark L. Munday It is certified that error appears in the above-identified patent and that said Letters Patent is hereby corrected as shown below:

<u>Title page,</u>
Item [56], U.S. PATENT DOCUMENTS,
"4,884,070" should read -- 4,881,070 --
Insert:
-- 3,569,818    3/1971    Dahlinger    321    2
   5,146,394    9/1992    Ishii et al.    363    16 --

Signed and Sealed this

Eighth Day of July, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,504,357 B1
DATED : January 7, 2003
INVENTOR(S) : Rodney C. Hemminger and Mark L. Munday It is certified that error appears in the above-identified patent and that said Letters Patent is hereby corrected as shown below:

Title page,
Item [56], References Cited, U.S. PATENT DOCUMENTS, "4,884,070" should read
-- 4,881,070 -- insert the followings:
-- 3,569,818    3/1971    Dahlinger    321    2
   5,146,394    9/1992    Ishii et al.    363    16 --
OTHER PUBLICATIONS, insert the following:
-- Laumann, H., et al., "Class 0,5 Precision Meter With Solid-State Measuring Elements," Landis & Gyr Review, September 1974

RM10 Portable Watthour Standard, Radian Research, June 23, 1985

Power Supply Schematics (2) for Radian Research RM-10, 10-20-1987

Steven E. Summer and Leonard Zuckerman, "Wide Input Range Multiple Output Power Supply IEEE Proceedings (April 1983)

MAXIM™ Polyphase Solid-State Meter, Schlumberger Industries, 1988

MAXIM™ Solid-State Meter, Schlumberger Industries (undated)

MAXIM™ Schlumberger Industries 1989

Progress in the Art of Metering Electric Energy, Electricity Metering Subcommittee on the IEEE Committee of Power System Instrumentation and Measurements, IEEE, December 1969 --

Signed and Sealed this

Fourteenth Day of December, 2004

JON W. DUDAS
*Director of the United States Patent and Trademark Office*